US012757593B2

(12) United States Patent
Cho et al.

(10) Patent No.: US 12,757,593 B2
(45) Date of Patent: Oct. 6, 2026

(54) DISPLAY APPARATUS

(71) Applicant: Samsung Display Co., LTD., Yongin-si (KR)

(72) Inventors: Youngjin Cho, Yongin-si (KR); Jisu Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 377 days.

(21) Appl. No.: 18/431,553

(22) Filed: Feb. 2, 2024

(65) Prior Publication Data

US 2024/0324340 A1 Sep. 26, 2024

(30) Foreign Application Priority Data

Mar. 24, 2023 (KR) ........................ 10-2023-0039208
Apr. 12, 2023 (KR) ........................ 10-2023-0048359

(51) Int. Cl.
*H10K 59/131* (2023.01)
*H10K 59/121* (2023.01)
*H10K 59/122* (2023.01)

(52) U.S. Cl.
CPC ......... *H10K 59/131* (2023.02); *H10K 59/121* (2023.02); *H10K 59/122* (2023.02)

(58) Field of Classification Search
CPC .......... H10D 1/60; H10D 1/692; H10K 10/85; H10K 59/121; H10K 59/1213; H10K 59/1216; H10K 59/122; H10K 59/131; H10K 59/179; H10K 59/805; H10K 59/90
See application file for complete search history.

(56) References Cited

U.S. PATENT DOCUMENTS

| | | | |
|---|---|---|---|
| 9,478,586 | B2 | 10/2016 | Lee |
| 10,431,604 | B2 | 10/2019 | Cho et al. |
| 10,978,538 | B2 | 4/2021 | Wang et al. |
| 2021/0126065 | A1 | 4/2021 | Kwon et al. |

FOREIGN PATENT DOCUMENTS

| | | |
|---|---|---|
| KR | 10-0932205 | 12/2009 |
| KR | 10-2021-0052650 | 5/2021 |
| KR | 10-2021-0123245 | 10/2021 |
| KR | 10-2021-0135977 | 11/2021 |
| KR | 10-2022-0110462 | 8/2022 |

*Primary Examiner* — Cheung Lee
(74) *Attorney, Agent, or Firm* — Sughrue Mion, PLLC

(57) ABSTRACT

Provided is a display apparatus, in which a parasitic capacitor is minimized or prevented, including a substrate, a semiconductor layer disposed on the substrate and including a source area and a drain area and a channel area disposed between the source area and the drain area, and a gate layer disposed on the semiconductor layer and including a gate area disposed on the channel area, a first conductive layer including a first subconductive layer disposed on the gate layer and electrically connected to the gate area, and a second conductive layer including a second subconductive layer disposed on the first conductive layer and electrically connected to the source area and covering the first subconductive layer.

21 Claims, 12 Drawing Sheets

DISPLAY APPARATUS

CROSS-REFERENCE TO RELATED APPLICATION(S)

This application claims priority under 35 U.S.C. § 119 to and benefits of Korean Patent Application No. 10-2023-0039208, filed on Mar. 24, 2023, and Korean Patent Application No. 10-2023-0048359, filed on Apr. 12, 2023, in the Korean Intellectual Property Office, the entire contents of which are incorporated herein by reference.

BACKGROUND

1. Technical Field

One or more embodiments relate to a display apparatus, and more particularly, to a display apparatus, in which the parasitic capacitor is minimized or prevented.

2. Description of the Related Art

A display apparatus is a device that receives information about an image and displays the image. Display apparatuses are sometimes used as the display part of small products such as cell phones, and sometimes as the display part of large products such as televisions.

A display apparatus includes pixels that receive an electrical signal and emit light to display an image externally. Each pixel includes a light-emitting element, for example, an organic light-emitting diode (OLED) in an organic light-emitting display apparatus. In general, an organic light-emitting display apparatus includes a thin-film transistor and an organic light-emitting diode on a substrate, and the organic light-emitting diode works by emitting light.

A source-follower type transistor may control the compensation voltage by using a storage capacitor. Therefore, the display apparatus including the source-follower type transistor is greatly affected by a parasitic capacitor that affect the capacity of the storage capacitor, and image quality is greatly affected by the parasitic capacitor.

SUMMARY

One or more embodiments provide a display apparatus capable of preventing or minimizing parasitic capacitors.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a substrate, a semiconductor layer disposed on the substrate and including a source area, a drain area, and a channel area disposed between the source area and the drain area, and a gate layer disposed on the semiconductor layer and including a gate area disposed on the channel area, a first conductive layer disposed on the gate layer and including a first subconductive layer electrically connected to the gate area, and a second conductive layer disposed on the first conductive layer, electrically connected to the source area, and including a second subconductive layer covering the first subconductive layer.

According to one or more embodiments at least a portion of the second subconductive layer may overlap the first subconductive layer in plan view.

According to one or more embodiments, the display apparatus may include a storage capacitor including a first storage capacitor electrode electrically connected to the first subconductive layer, and a second storage capacitor electrode electrically connected to the second subconductive layer.

According to one or more embodiments, the semiconductor layer may include an oxide semiconductor.

According to one or more embodiments, the display apparatus may further include a pixel electrode disposed on the second conductive layer, and a pixel defining film adjacent to an edge portion of the pixel electrode and including a pixel opening exposing at least a central area of the pixel electrode.

According to one or more embodiments, the second subconductive layer may be disposed between the first subconductive layer and the pixel electrode.

According to one or more embodiments, the first conductive layer may further include a first-first subconductive layer connected to the source area, the first-first subconductive layer and the first subconductive layer formed as a same layer, and the display apparatus may further include a first organic insulation layer disposed between the first conductive layer and the second conductive layer and including a through hole connecting the first-first subconductive layer and the second subconductive layer.

According to one or more embodiments, the through hole of the first organic insulation layer may be disposed outside the pixel opening in plan view.

According to one or more embodiments, the first subconductive layer may partially overlap the pixel opening in plan view.

According to one or more embodiments, the second subconductive layer may partially overlap the pixel opening in plan view.

According to one or more embodiments, the first conductive layer may further include a first additional subconductive layer disposed at a position at a position symmetrical to the first subconductive layer around the pixel opening in plan view, the first additional subconductive layer having a shape corresponding to a shape of the first subconductive layer.

According to one or more embodiments, the second conductive layer may further include a second additional subconductive layer disposed at a position symmetrically with the second subconductive layer around the pixel opening in plan view, the second additional subconductive layer having a shape corresponding to the shape of the second subconductive layer.

According to one or more embodiments, the second additional subconductive layer may overlap the first additional subconductive layer in plan view.

According to one or more embodiments, in plan view, the first subconductive layer may extend in a first direction being parallel to a direction in which a drive power wiring of the second conductive layer extends.

According to one or more embodiments, the display apparatus may further include a first submetal layer disposed between the substrate and the semiconductor layer and including a second storage capacitor electrode, the gate layer includes a first storage capacitor electrode, wherein the first storage capacitor electrode and the second storage capacitor electrode may be included in a single storage capacitor.

According to one or more embodiments, wherein the semiconductor layer and the gate layer may be included in a first transistor, and the first transistor may be a source-follower type.

According to one or more embodiments, the display apparatus may include a substrate, a first transistor disposed on the substrate, including an oxide semiconductor layer with a source area, a channel area, and a drain area, and a gate area disposed on the channel area, a first wiring connected to the gate area and extending in a first direction disposed on the first transistor, a pixel electrode disposed on the first wiring, a second wiring disposed between the first wiring and the pixel electrode, connected to the source area and overlapping at least partially with the first wiring in plan view.

According to one or more embodiments, the first wiring and the second wiring may be included in a storage capacitor.

According to one or more embodiments, the display apparatus may further include a first organic insulation layer disposed between the first wiring and the second wiring and including a through hole connecting the first wiring and the second wiring, and a pixel defining film including a pixel opening adjacent to an edge portion of the pixel electrode and exposing at least a central portion of the pixel electrode, wherein the pixel electrode may be disposed on the second wiring, and the through hole may be disposed outside the pixel opening in plan view.

According to one or more embodiments, the first transistor may be a source-follower type. The display apparatus may further include a drive power wiring extending in the first direction, wherein the drive power wiring and the second wiring may be formed as a same layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
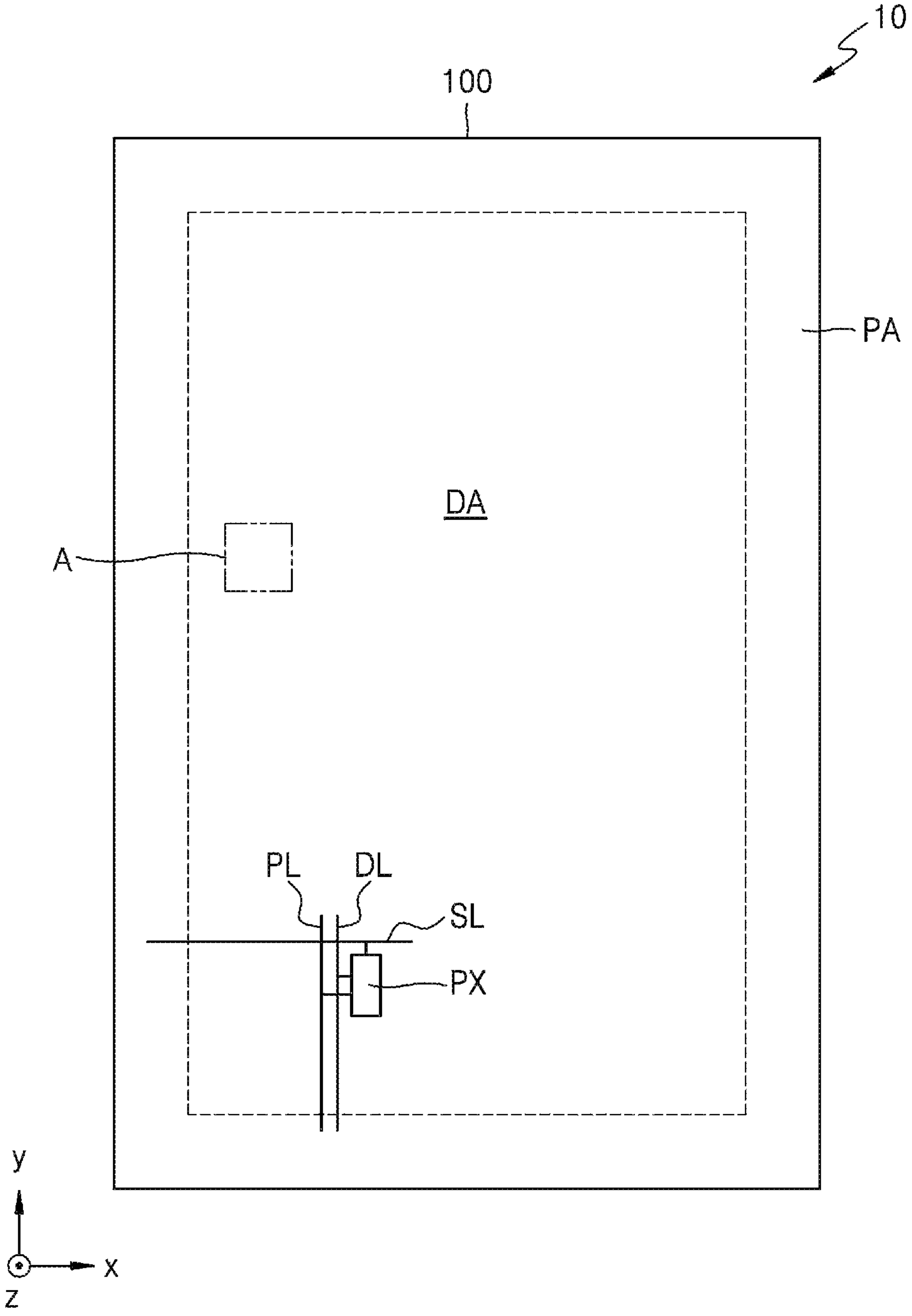
FIG. 1 is a schematic plan view illustrating a display panel included in a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z axes, and may be interpreted in a broader sense. For example, the x-axis, the y-axis, and the z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above"

the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Based on the above, a display apparatus according to one preferred embodiment of the disclosure will be described in detail as follows.

FIG. 1 is a schematic plan view illustrating a display panel included in a display apparatus according to an embodiment.

As shown in FIG. 1, a display apparatus according to an embodiment may include a display panel 10. Such a display apparatus may be any device that includes a display panel 10. For example, the display apparatus may be a variety of devices such as a smartphone, a tablet, laptop, a television, or a billboard. The display apparatus according to an embodiment may include thin-film transistors, capacitors, and the like. The thin-film transistors, capacitors, and the like may be implemented by the conductive layers and insulation layers.

The display panel 10 may include a display area DA and a peripheral area PA positioned outside the display area DA. In FIG. 1, the display area DA is illustrated as a rectangular shape. However, embodiments are not limited thereto. The display area DA may have a variety of shapes, such as, for example, a circular shape, an oval shape, a polygonal shape, or a shape of a specific shape.

The display area DA may be the part that displays the image and may include pixels PX. Each pixel PX may include a display element, such as an organic light-emitting diode. Each pixel PX may emit light, for example, red light, green light, or blue light. These pixels PX may be coupled to a pixel circuit, which includes a thin-film transistor (TFT), a storage capacitor, etc. These pixel circuits may be connected to a scan line SL that transmits a scan signal, a data line DL that intersects the scan line SL and transmits a data signal, and a drive voltage line PL that supplies a drive voltage, etc. The scan line SL may extend in the x-axis direction (hereinafter referred to as the second direction), and the data line DL and the drive voltage line PL may extend in the y-axis direction (hereinafter referred to as the first direction).

The pixel PX may emit light of a luminance corresponding to an electrical signal transmitted from an electrically connected pixel circuit. The display area DA may display a certain image by the light emitted by the pixel PX. For reference, the pixel PX may be defined as a light-emitting area that emits light of any one of the colors red, green, and blue as described above.

The peripheral area PA may be an area in which pixels PX are not arranged, and may be an area that does not display an image. In the peripheral area PA, a power supply wiring for driving the pixels PX may be positioned. For example, pads may be arranged in the peripheral area PA, and integrated circuits such as printed circuit boards including drive circuitry or driver ICs may be arranged to be electrically connected to the pads.

Since the display panel 10 includes a substrate 100, the substrate 100 may be considered as having such a display area DA and a peripheral area PA. More details about the substrate 100 will be described below.

For example, transistors may be arranged in the display area DA. According to the type of transistor (N-type or P-type) and/or operating conditions, a first terminal of the transistor may be a source electrode or a drain electrode, and a second terminal may be an electrode different from the first terminal. For example, in case that the first terminal is a source electrode, the second terminal may be a drain electrode.

The transistors may include a drive transistor, a data input transistor, a compensation transistor, an initialization transistor, a light emission control transistor, etc. The drive transistor may be connected between the drive voltage line PL and the organic light-emitting diode OLED, and the data input transistor may be connected to the data line DL and the drive transistor, and may perform a switching operation to transmit a data signal transferred to the data line DL.

The compensation transistor may be turned on in response to a scan signal received by the scan line SL to compensate a threshold voltage of the drive transistor by connecting the drive transistor and an organic light-emitting diode OLED.

The initialization transistor may be turned on in response to a scan signal received by the scan line SL to transfer an initialization voltage to the gate electrode of the drive transistor to initialize the gate electrode of the drive transistor. The scan line connected to the initialization transistor may be a separate scan line from the scan line connected to the compensation transistor.

The light emission control transistor may be turned on in response to a light emission control signal received by the light emission control line, thereby flowing a drive current flowing to the organic light-emitting diode OLED.

The organic light-emitting diode OLED may include a pixel electrode (e.g., anode) and a counter electrode (e.g., cathode), and the counter electrode 230 may receive a second power supply voltage ELVSS. The organic light-emitting diode OLED may receive the drive current from the drive transistor and emit light to display an image.

Hereinafter, an organic light-emitting display apparatus will be described as a display apparatus according to an embodiment, but embodiments are not limited thereto. In other embodiments, the display apparatus may be an inorganic light-emitting display, an inorganic electroluminescent (EL) display apparatus, or a quantum dot light-emitting display. For example, an emission layer of a display element included in a display apparatus may include an organic material or an inorganic material. For example, the display apparatus may be provided with an emission layer and quantum dots positioned in a path of light emitted from the emission layer.

Figure 2:
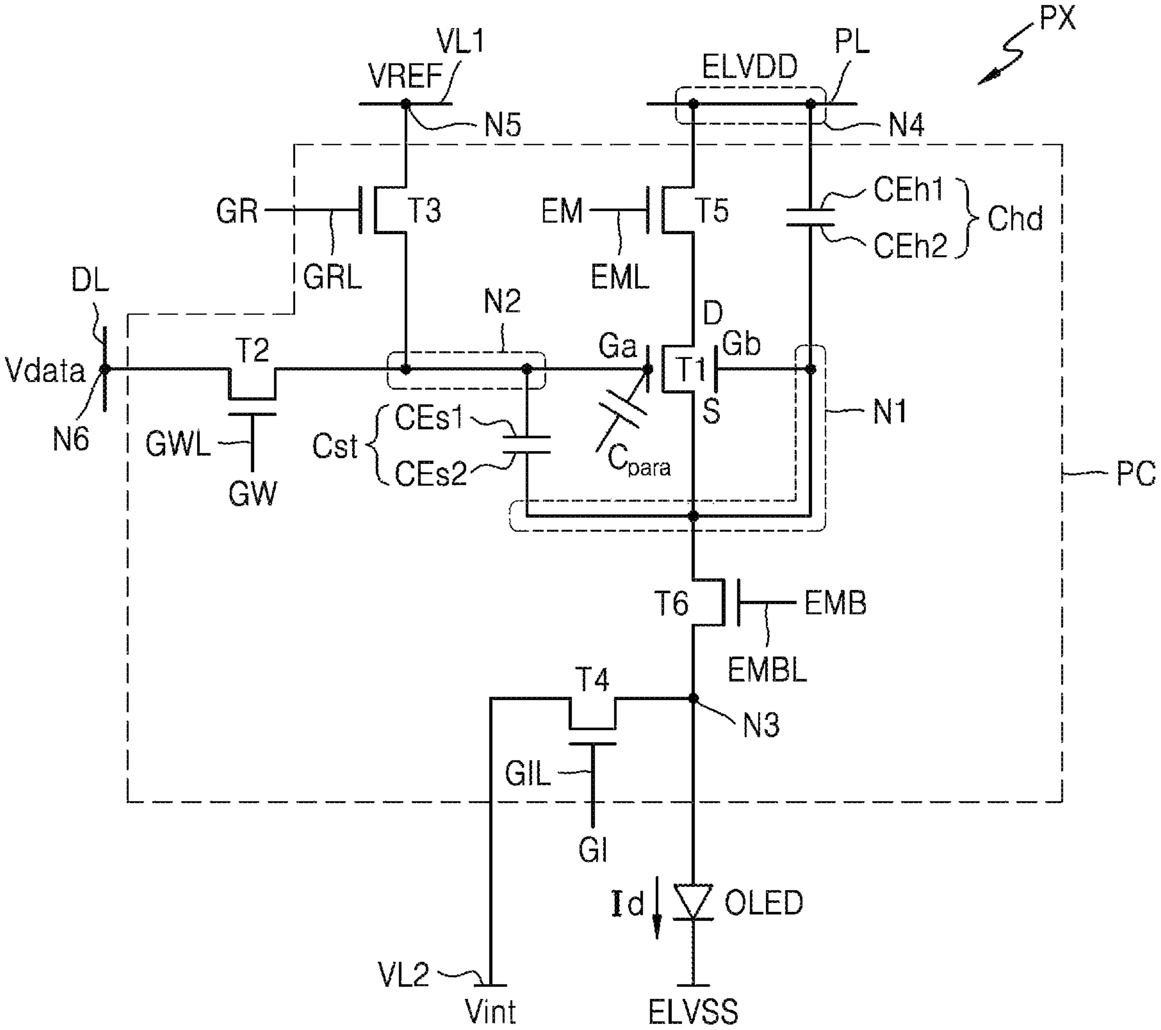
FIG. 2 is a schematic diagram of an equivalent circuit of a pixel of the display panel of FIG. 1.

FIG. 2 is a schematic diagram of an equivalent circuit of a representative pixel of the display panel of FIG. 1.

Referring to FIG. 2, a pixel PX may include a pixel circuit PC and a display element electrically connected to the pixel circuit PC. The display element may be an organic light-emitting diode OLED that has an anode (e.g., pixel electrode) and a cathode (e.g., counter electrode).

In an example, a pixel circuit PC may include a first transistor T1, a second transistor T2, a third transistor T3, a fourth transistor T4, a fifth transistor T5, and a sixth transistor T6, a storage capacitor Cst, and a hold capacitor Chd, as shown in FIG. 2. The first transistor T1 to the sixth transistor T6, the storage capacitor Cst, and the hold capacitor Chd may be connected to a first scan line GWL, a second scan line GRL, and a third scan line GIL respectively transmitting a first scan signal GW, a second scan signal GR, and a third scan signal GI; data lines DL transmitting data voltage Vdata; a first light emission control line EML and a second light emission control line EMBL respectively transmitting a first light emission control signal EM and a second light emission control signal EMB; a drive voltage line PL transmitting a first power supply voltage (or drive voltage) ELVDD; a first voltage line VL1 transmitting a reference voltage VREF; a second voltage line VL2 transmitting an initialization voltage Vint; and a common electrode to which the second power supply voltage ELVSS is applied.

The first transistor T1 may be a drive transistor whose magnitude of drain current is determined by a gate-source voltage (or upper gate-source voltage), and a second transistor T2 to a sixth transistor T6 may be switching transistors that are turned on/off according to the gate-source voltage (or a gate voltage). The first transistor T1 to the sixth transistor T6 may be formed as thin-film transistors. The first transistor T1 may be a source-follower type.

In an embodiment, the first transistor T1 to the sixth transistor T6 may be provided as n-channel MOSFETs (NMOS), as shown in FIG. 2. In another embodiment, some of the first transistor T1 to the sixth transistor T6 may be provided as NMOS and the remaining transistors may be provided as p-channel MOSFETs (PMOS). In another embodiment, the first transistor T1 to the sixth transistor T6 may be provided as PMOS.

In an embodiment, semiconductor layers of the first transistor T1 to the sixth transistor T6 may include an oxide of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, a semiconductor layer may be an InSnZnO (ISZO) semiconductor layer, an InGaZnO (IGZO) semiconductor layer, etc.

As another example, the first transistor T1 to the sixth transistor T6 may include a semiconductor layer including silicon. In an example, the first transistor T1 to the sixth transistor T6 may include a semiconductor layer including low temperature poly-silicon (LTPS). Polysilicon materials have high electron mobility, which is greater than 100 $cm^2/Vs$, low energy consumption, and high reliability.

In another example, some semiconductor layers of the first transistor T1 to the sixth transistor T6 may be formed of LTPS, and other semiconductor layers may be formed of oxide semiconductors (IGZO, etc.).

The storage capacitor Cst may have a first storage capacitor electrode CEs1 and a second storage capacitor electrode CEs2. The hold capacitor Chd may have a first hold capacitor electrode CEh1 connected to the drive voltage line PL and a second hold capacitor electrode CEh2 connected to a second storage capacitor electrode CEs2 of the storage capacitor Cst.

The first transistor T1 may control the magnitude (or amount) of a drive current Id flowing from the drive voltage line PL to the organic light-emitting diode OLED according to a gate-source voltage (or upper gate-source voltage). The first transistor T1 may have an upper gate Ga connected to the first storage capacitor electrode CEs1 of the storage capacitor Cst, a drain D connected to the drive voltage line PL through the fifth transistor T5, a source S connected to an organic light-emitting diode OLED through the sixth transistor T6, and a lower gate Gb connected to the second hold capacitor electrode CEh2 of the hold capacitor Chd. The lower gate Gb of the first transistor T1 may be connected to a source S of the first transistor T1.

The first transistor T1 may output the drive current Id to the organic light-emitting diode OLED according to a gate-to-source voltage. The magnitude of the drive current Id may be determined based on the difference between the gate-source voltage and a threshold voltage of the first transistor T1. The organic light-emitting diode OLED may receive the drive current Id from the first transistor T1 and may emit light having a brightness based on the magnitude of the drive current Id.

A second transistor T2 may connect the data line DL to the first storage capacitor electrode CEs1 of the storage capacitor Cst (or an upper gate Ga of the first transistor T1) in response to the first scan signal GW. The second transistor T2 may connect the data line DL and the first storage capacitor electrode CEs1 of the storage capacitor Cst (e.g., the upper gate Ga of the first transistor T1) to each other in response to the first scan signal GW. The second transistor T2 may transmit a data voltage Vdata to the first storage capacitor electrode CEs1 of the storage capacitor Cst (e.g., the upper gate Ga of the first transistor T1) in response to the first scan signal GW.

A third transistor T3 may connect the first voltage line VL1 to the upper gate Ga of the first transistor T1 in response to the second scan signal GR. The third transistor T3 may connect the first voltage line VL1 and the upper gate Ga of the first transistor T1 to each other in response to the second scan signal GR. The third transistor T3 may apply a reference voltage VREF to the upper gate Ga of the first transistor T1 in response to the second scan signal GR.

A fourth transistor T4 may connect the second voltage line VL2 to an anode of the organic light-emitting diode OLED in response to the third scan signal GI. The fourth transistor T4 may connect the second voltage line VL2 and the anode of the organic light-emitting diode OLED to each other in response to the third scan signal GI. The fourth transistor T4 may apply an initialization voltage Vint to the anode of the organic light-emitting diode OLED in response to the third scan signal GI.

The fifth transistor T5 may connect the drive voltage line PL to a drain D of the first transistor T1 in response to the first light emission control signal EM. The fifth transistor T5 may connect the drive voltage line PL and the drain D of the first transistor T1 to each other in response to the first light emission control signal EM. The fifth transistor T5 may apply a first power supply voltage (or drive voltage) ELVDD to the drain D of the first transistor T1 in response to the first light emission control signal EM.

The sixth transistor T6 may connect the source S of the first transistor T1 to the anode of the organic light-emitting diode OLED in response to the second light emission control signal EMB. The sixth transistor T6 may connect the source S of the first transistor T1 and the anode of the organic light-emitting diode OLED to each other in response to the second light emission control signal EMB.

In FIG. 2, the fifth transistor T5 and the sixth transistor T6 are illustrated as operating in response to different light emission control signals EM and EMB, respectively, but in other embodiments, the fifth transistor T5 and the sixth transistor T6 may operate in response to the same light emission control signal.

In an embodiment, the second scan signal GR may be substantially synchronized with the first scan signal GW of the previous row. The third scan signal GI may be substantially synchronized with the first scan signal GW. According to another example, the third scan signal GI may be substantially synchronized with the first scan signal GW of the next row or the second scan signal GR of the next row.

For example, while FIG. 2 illustrates the pixel circuit PC including six transistors and two capacitors, in another embodiment, the pixel circuit PC may include five transistors and two capacitors. In another embodiment, the pixel circuit PC may include seven transistors and two capacitors.

Referring to FIG. 2, the pixel circuit PC may include nodes (e.g., N1, N2, N3, N4, and N5).

A first node N1 may be a node electrically connected to the source S of the first transistor T1, and may be a node electrically connected to the second storage capacitor electrode CEs2 of the storage capacitor Cst. The first node N1 may be a node electrically connected to the sixth transistor T6. For example, the first node N1 may be a node connected to a drain of the sixth transistor T6.

The second node N2 may be a node electrically connected to the gate Ga of the first transistor T1, and may be a node electrically connected to the second transistor T2 and the third transistor T3. For example, the second node N2 may be a node electrically connected to a source of the second transistor T2 and a source of the third transistor T3. The second node N2 may be a node electrically connected to the first storage capacitor electrode CEs1 of the storage capacitor Cst.

The third node N3 may be a node electrically connected to the fourth transistor T4 and the sixth transistor T6, and may be a node electrically connected to an organic light-emitting diode OLED. For example, the third node N3 may be a node electrically connected to a drain of the fourth transistor T4 and a source of the sixth transistor T6.

A fourth node N4 may be a node electrically connected to the fifth transistor T5 and the drive voltage line PL, and may be a node to which the drive voltage ELVDD is applied. For example, the fourth node N4 may be electrically connected to a drain of the fifth transistor T5. The fourth node N4 may be a node electrically connected to the first hold capacitor electrode CEh1.

The fifth node N5 may be a node electrically connected to the third transistor T3 and the first voltage line VL1, and may be a node to which the reference voltage VREF is applied. For example, the fifth node N5 may be electrically connected to a drain of the third transistor T3.

The sixth node N6 may be a node electrically connected to the second transistor T2 and the data line DL, and may be a node to which the data voltage Vdata is applied. For example, the sixth node N6 may be electrically connected to a drain of the second transistor T2.

Referring to FIG. 2, the first transistor T1 may be a source-follower type. The first transistor T1 of the source-follower type may be relatively affected by a parasitic capacitor Cpara. The source-follower type transistor may be used in oxide semiconductors, and the source-follower type transistor may be used in case that the transistor is formed of oxide semiconductors.

The parasitic capacitor Cpara may be formed between the gate Ga of the first transistor T1 and the drive voltage line PL that transfers the first power supply voltage (or drive voltage) ELVDD or a pixel electrode to be described below. For example, the parasitic capacitor Cpara may be electrically connected to the second node N2 and electrically connected to the first storage capacitor electrode CEs1.

The parasitic capacitor Cpara may significantly affect the compensation voltage applied to the gate Ga of the first transistor T1 of the source-follower type. For example, the parasitic capacitor Cpara may have a greater influence on the transistor of the source-follower type. Therefore, parasitic capacitors Cpara may be minimized or prevented in case that transistors are the source-follower type.

Figure 3:
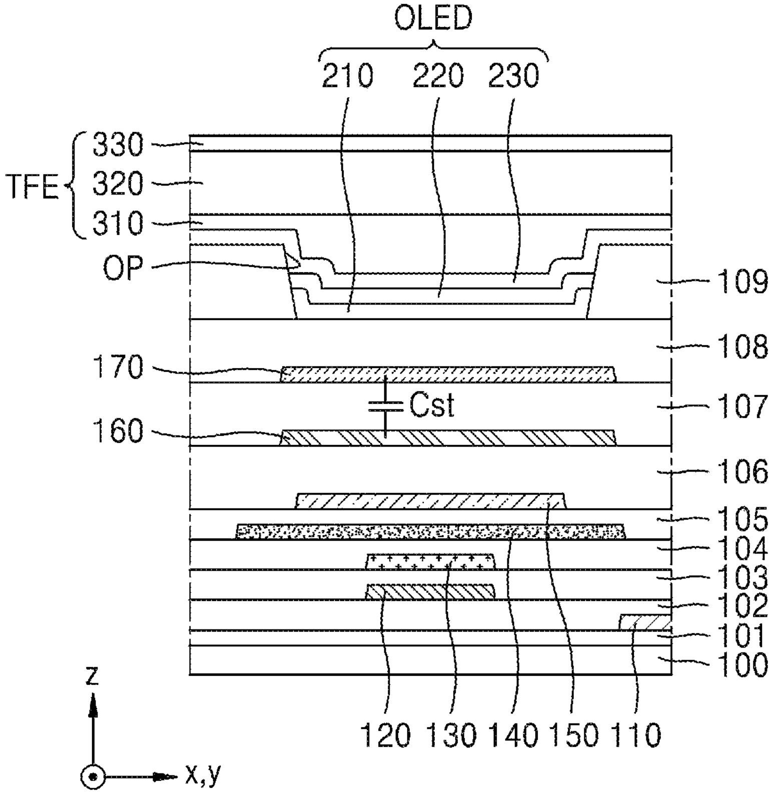
FIG. 3 is a schematic cross-sectional view of a pixel of the display panel of FIG. 1.

FIG. 3 is a schematic cross-sectional view of a pixel PX of the display panel of FIG. 1.

Referring to FIG. 3, as described above, the substrate 100 may include a display area DA and a peripheral area PA outside the display area DA. The substrate 100 may include various materials having flexible or bendable properties.

For example, the substrate 100 may include glass, metal, or polymer resin. For example, the substrate 100 may include polyethersulfone, polyacrylate, polyetherimide, polyethylene naphthalate, and polyethylene terephthalate, polyphenylene sulfide, polyarylate, polyimide, polycarbonate, or a polymeric resin such as cellulose acetate propionate. Various variations are possible, such as the substrate 100 may have a multi-layer structure including two layers each including such a polymeric resin and a barrier layer including an inorganic material (e.g., silicon oxide, silicon nitride, silicon oxynitride, etc.) disposed between the layers.

A buffer layer 101 may be positioned on the substrate 100. The buffer layer 101 may function as a barrier layer and/or blocking layer to prevent impurity ions from diffusing, to prevent moisture or air infiltration, and/or to level a surface. The buffer layer 101 may include silicon oxide, silicon nitride, or silicon oxynitride. For example, the buffer layer 101 may regulate the rate at which heat is provided during the crystallization process to form a semiconductor layer 140, so that the semiconductor layer 140 may be crystallized uniformly.

The semiconductor layer 140 may be positioned on the buffer layer 101. The semiconductor layer 140 may include a polysilicon or oxide semiconductor, and may include a channel area undoped with impurities, and a source area and a drain area formed by doping with impurities on either side of the channel area. The impurity may be determined (or selected) based on the type of thin-film transistor, and may be an N-type impurity or a P-type impurity. Preferably, the semiconductor layer 140 may include an oxide semiconductor, or may be made of an oxide semiconductor.

For example, a display apparatus according to an embodiment may include a plurality of transistors, and the transistors among the plurality of transistors arranged in the display area DA may all include an oxide semiconductor. In an example, the transistors arranged in the display area DA may be implemented as a single oxide semiconductor layer. Specific embodiments will be described below.

Between the buffer layer 101 and the semiconductor layer 140, a submetal layer may be further included. The display apparatus may include only one submetal layer, or two or more submetal layers. The submetal layer may cover at least a portion of the display area DA.

In an example, the submetal layer may include a first submetal layer 130, a second submetal layer 120, and a third submetal layer 110. The first submetal layer 130 may be disposed over the second submetal layer 120, and an insulation layer 103 including an inorganic material may be disposed between the first submetal layer 130 and the second submetal layer 120. The second submetal layer 120 may be disposed over the third submetal layer 110, and an insulation layer 102 including an inorganic material may be further disposed between the second submetal layer 120 and the third submetal layer 110. An insulation layer 104 including an inorganic material may be disposed between the first submetal layer 130 and the semiconductor layer 140.

The submetal layer may be disposed under the wiring of the display apparatus and under the plurality of transistors. The submetal layer may prevent external light from reaching the wiring. The submetal layer may also prevent external light from reaching the semiconductor layer 140, which includes an oxide semiconductor. This is because oxide semiconductors are sensitive to light, and external light causes fluctuations in current, etc. The submetal layer may include a metal such as silver, copper, or aluminum.

A gate insulation film 105 may be positioned on the semiconductor layer 140. The gate insulation film 105 may be formed to provide insulation between the semiconductor layer 140 and a gate layer 150 to be described below. The gate insulation film 105 may include an inorganic material such as silicon oxide, silicon nitride, and/or silicon oxynitride, etc., and may be disposed between the semiconductor layer 140 and the gate layer 150. For example, the gate insulation film 105 may have a formation corresponding to the front surface of the substrate 100, and may have a structure with contact holes formed in a certain portion. For example, insulating films including inorganic materials may be formed by chemical vapor deposition (CVD) or atomic layer deposition (ALD).

The gate layer 150 may be positioned on the gate insulation film 105. The gate layer 150 may be disposed at a position overlapping the semiconductor layer 140 and may include at least one metal such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

For example, the semiconductor layer 140, the gate insulation film 105, and the gate layer 150 may form at least one of the transistors described above in FIG. 2. The semiconductor layer 140, the gate insulation film 105, and the gate layer 150 may compose at least one of the transistors described in FIG. 2 according to a certain pattern of shape.

An interlayer insulation film 106 may be positioned on the gate layer 150. The interlayer insulation film 106 may cover the gate layer 150. The interlayer insulation film 106 may be made of an inorganic material. For example, the interlayer insulation film 106 may be a metal oxide or metal nitride. The inorganic material may include silicon oxide ($SiO_2$), silicon nitride ($SiN_x$), silicon oxide ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZrO_2$), etc. The interlayer insulation film 106 may, in some embodiments, include a dual structure of $SiO_x/SiN_y$ or $SiN_x/SiO_y$.

A first conductive layer 160 may be positioned on the interlayer insulation film 106. The first conductive layer 160 may include electrodes that are connected to a source/drain area or gate layer of the semiconductor layer 140 by a through hole included in the interlayer insulation film 106. In an example, the first conductive layer 160 may include a gate electrode that is electrically connected to the gate layer and composes the working electrode of the storage capacitor Cst. The first conductive layer 160 may be electrically connected to other components according to its position.

The first conductive layer 160 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the first conductive layer 160 may include a Ti layer, an Al layer, and/or a Cu layer.

The first organic insulation layer 107 may be positioned on the first conductive layer 160. The first organic insulation layer 107 may be an organic insulation layer that covers the upper surface of the first conductive layer 160 and has a substantially flat top surface (or flat upper surface), acting as a planarization film. The first organic insulation layer 107 may include an organic material such as, for example, acrylic, benzocyclobutene (BCB), or hexamethyldisiloxane (HMDSO), etc. The first organic insulation layer 107 may be modified in various ways, such as being composed of a single-layer or multiple layers.

A second conductive layer 170 may be positioned on the first organic insulation layer 107. The second conductive layer 170 may function as an electrode that is connected to the source/drain areas of the semiconductor layer 140 by a through hole included in the first organic insulation layer 107. For example, the second conductive layer 170 may be electrically connected to the source area of the semiconductor layer 140. The second conductive layer 170 may be electrically connected to the first conductive layer 160 and may be electrically connected to other components according to the position of the connected first conductive layer 160.

The second conductive layer 170 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the second conductive layer 170 may include a Ti layer, an Al layer, and/or a Cu layer.

A second organic insulation layer 108 may be positioned on the second conductive layer 170. The second organic insulation layer 108 may be an organic insulation layer that covers the upper surface of the second conductive layer 170 and has a substantially flat top surface (or flat upper surface), as a planarization film. The second organic insulation layer 108 may include an organic material such as, for example, acrylic, BCB, or HMDSO, etc. The second organic insulation layer 108 may be modified in various ways, such as being composed of a single-layer or multiple layers.

For example, additional conductive layers and additional insulation layers may be disposed between the second conductive layer 170 and a pixel electrode 210, and may be applied in various embodiments. The additional conductive layer and the second conductive layer 170 described above may include the same material, and may have the same layered structure. The additional insulation layer and the organic insulation layer described above may include the same material, and may have the same layered structure.

In the disclosure, a pixel circuit layer including the semiconductor layer 140, the gate insulation film 105, the gate layer 150, the interlayer insulation film 106, and the first conductive layer 160 and second conductive layer 170, and the first organic insulation layer 107 and second organic insulation layer 108 may be provided. For example, the pixel circuit layer may be defined as a term referring to the layers disposed between the substrate 100 described above and the pixel electrode 210 described below, and may be used for convenience of description.

The pixel electrode 210 may be positioned on the second organic insulation layer 108. The pixel electrode 210 may be connected to the second conductive layer 170 by contact holes formed in the second organic insulation layer 108. A display element may be positioned on the pixel electrode 210. An organic light-emitting diode OLED may be utilized as the display element. For example, the organic light-emitting diode OLED may be provided, for example, on a pixel electrode 210. Such a pixel electrode 210 may include a light-transmitting conductive layer formed of a light-transmitting conductive oxide such as ITO, $In_2O_3$, or IZO, and a reflective layer formed of a metal such as Al or Ag. For example, the pixel electrode 210 may have a three-layered structure of ITO/Ag/ITO.

A pixel defining film 109 may be positioned on the second organic insulation layer 108 and may be disposed to cover (or be adjacent to) the edge portion of the pixel electrode 210. For example, the pixel defining film 109 may cover (or be adjacent to) the edge portion of the pixel electrode 210. The pixel defining film 109 may have an opening corresponding to the pixel, and the opening may be formed to expose at least a center portion of the pixel electrode 210.

Such a pixel defining film 109 may include, for example, an organic material such as polyimide or HMDSO, etc. For example, spacers may be arranged on the pixel defining film 109. The spacers are illustrated as being positioned in the peripheral area PA, but may also be positioned in the display area DA. The spacer may prevent the organic light-emitting diode OLED from being damaged by sagging of a mask in a manufacturing process utilizing the mask. The spacer may include an organic insulation material or and may be formed as a single-layer or multiple layers.

An intermediate layer 220 and a counter electrode 230 may be positioned over the opening. The intermediate layer 220 may include a low molecular weight material or a polymeric material. In case that the intermediate layer 220 includes a low molecular weight material, the intermediate layer 220 may include a hole injection layer (HIL), a hole transport layer (HTL), an emission layer EML, an electron transport layer (ETL), and/or an electron injection layer (EIL), etc. In case that the intermediate layer 220 includes a polymeric material, the intermediate layer 220 may have a structure that typically includes the hole transport layer (HTL) and the emission layer EML. The counter electrode 230 may include a light-transmitting conductive layer formed of a light-transmitting conductive oxide such as ITO, $In_2O_3$, or IZO, etc. The pixel electrode 210 may be used as an anode, and the counter electrode 230 may be used as a cathode. For example, the polarity of the electrodes may be reversed.

The structure of the intermediate layer 220 is not limited to the above, and may have various structures. For example, at least one of the layers including intermediate layer 220 may be integral with the counter electrode 230. In another embodiment, the intermediate layer 220 may include a layer patterned to correspond to each of the pixel electrodes 210.

The counter electrode 230 may be arranged on the display area DA, and may be arranged in front of the display area DA. For example, the counter electrode 230 may be integrally formed to cover pixels. The counter electrode 230 may be in electrical contact with a common power supply line arranged in the peripheral area PA. In an embodiment, the counter electrode 230 may extend to a partition wall.

A thin-film encapsulation layer TFE may cover the whole display area DA, and may be arranged to extend toward the peripheral area PA to cover at least a portion of the peripheral area PA. The thin-film encapsulation layer TFE may include a first inorganic encapsulation layer 310, a second inorganic encapsulation layer 330, and an organic encapsulation layer 320 disposed therebetween.

The first inorganic encapsulation layer 310 and the second inorganic encapsulation layer 330 may include one or more inorganic materials such as aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may be a single-layer or multiple layers including the above materials. The first inorganic encapsulation layer 310 and the second inorganic encapsulation layer 330 may include the same material or may include different materials.

The first inorganic encapsulation layer 310 and the second inorganic encapsulation layer 330 may have different thicknesses. The thickness of the first inorganic encapsulation layer 310 may be greater than the thickness of the second inorganic encapsulation layer 330. In another example, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same as each other.

The organic encapsulation layer 320 may include a monomeric material or a polymeric material. Polymeric materials may include acrylic-based resins, epoxy-based resins, polyimides, and polyethylene, etc. In an embodiment, the organic encapsulation layer 320 may include an acrylate.

Figure 4:
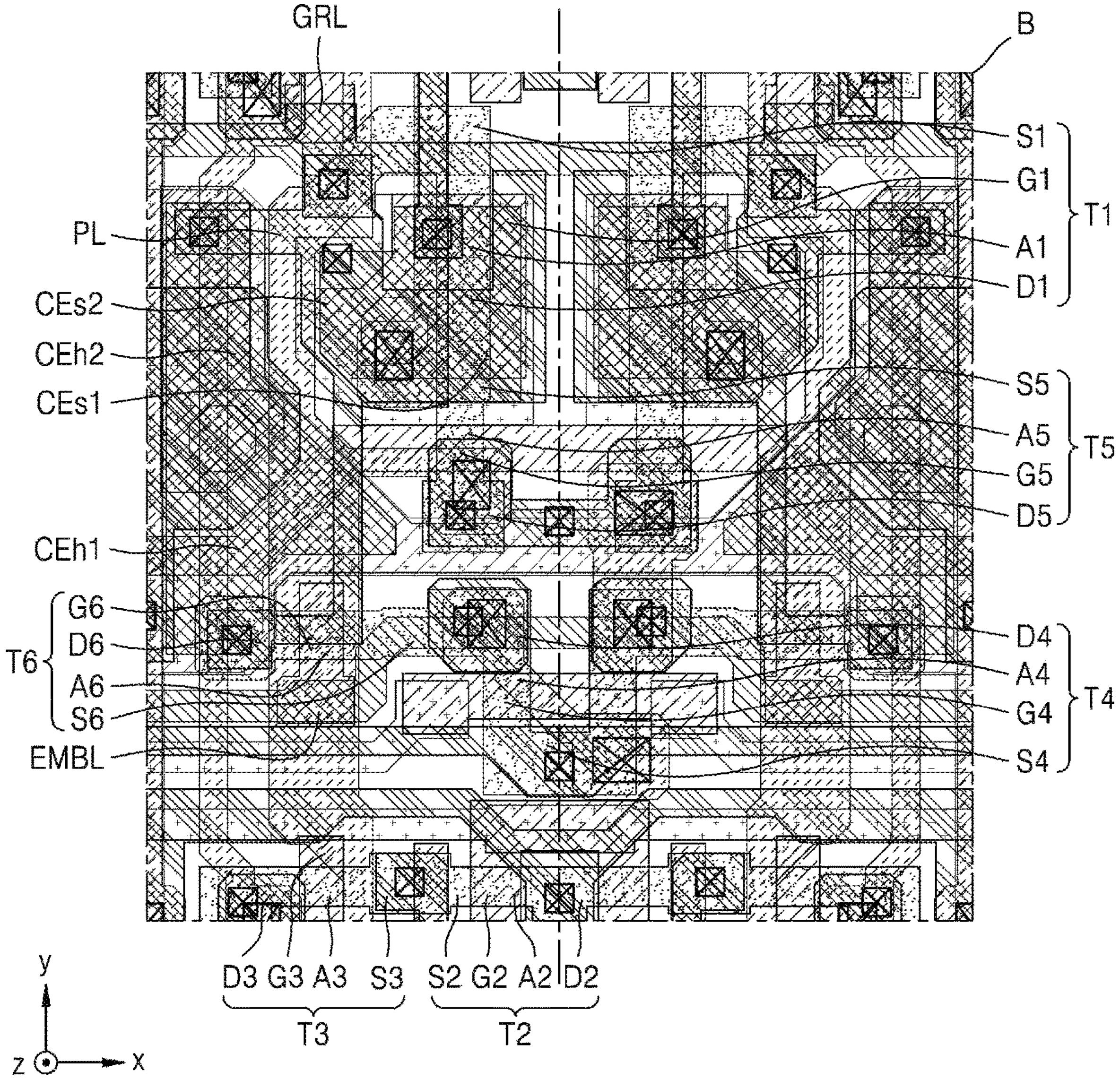
FIG. 4 is an example layout diagram illustrating the layout of area A of the display apparatus of FIG. 1.

FIG. 4 is an example layout diagram illustrating the layout of area A of the display apparatus of FIG. 1, and FIGS. 5, 6, 7, 8, 9, 10, and 11 are example layout diagrams schematically illustrating components of area A of the display apparatus of FIG. 1, layer by layer.

In FIGS. 4, 5, 6, 7, 8, 9, 10, and 11, the y-axis direction is a vertical direction in plan view, and may refer to a direction parallel to the direction in which the drive voltage line PL included in the second conductive layer 170 extends. The y-axis direction may be defined as a first direction for convenience of description. The x-axis direction may refer to a horizontal direction in a plan view, and may refer to a direction intersecting or orthogonal to the y-axis direction. The x-axis direction may be defined as a second direction for convenience of description.

Figure 5:
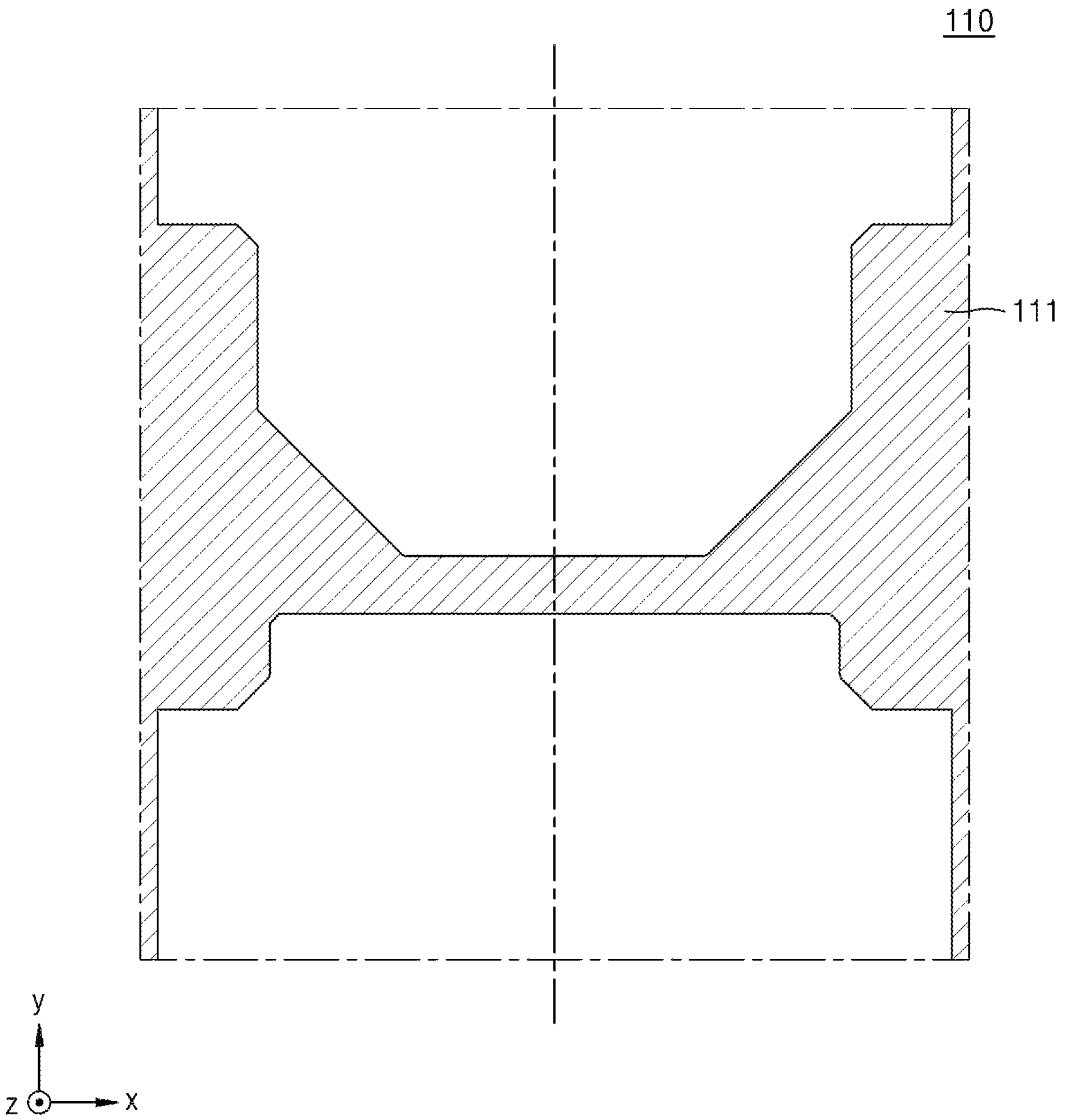
FIGS. 5, 6, 7, 8, 9, 10, and 11 are example layout diagrams schematically illustrating components of the area A of the display apparatus of FIG. 1 layer by layer.

As shown in FIG. 4 and FIG. 5, the third submetal layer 110 may have a left-right symmetrical structure relative to the dotted line of FIG. 5. Hereinafter, for convenience of description, only one side of the structure will be described based on the symmetrical structure.

The third submetal layer 110 may have a shape (111) corresponding to the 2-1st submetal layer 121. The third submetal layer 110 may be formed to protect other capacitor electrodes from the rear and to prevent external light from affecting the other capacitor electrodes. The third submetal layer 110 may be disposed at the lowest position of the submetal layers.

Figure 6:
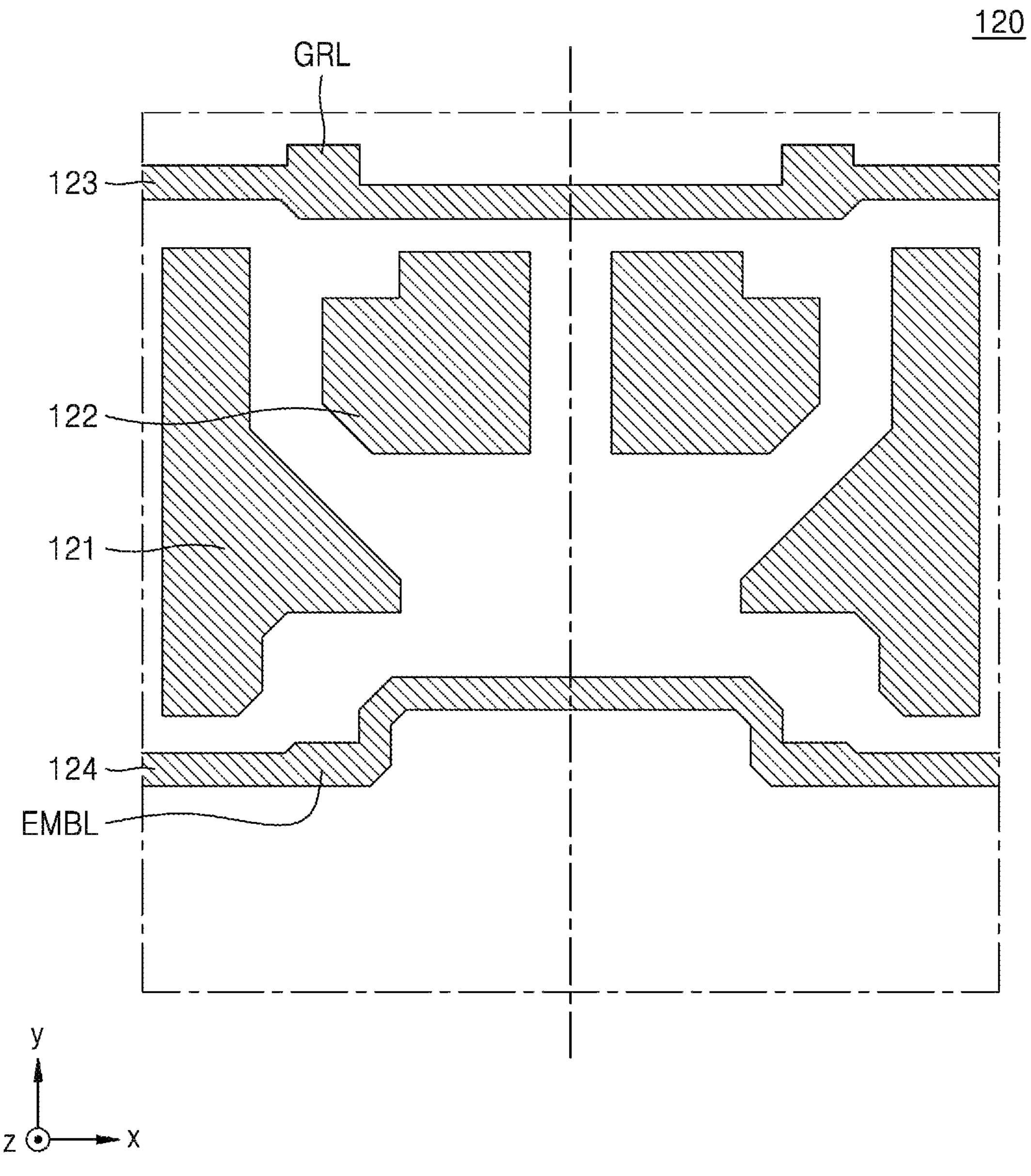

As shown in FIG. 4 and FIG. 6, the second submetal layer 120 may have a left-right symmetrical structure relative to the dotted line of FIG. 6. Hereinafter, for convenience of description, only one side of the structure will be described based on the symmetrical structure.

The second submetal layer 120 may include a 2-1st submetal layer 121, a 2-2nd submetal layer 122, a 2-3rd submetal layer 123, and a 2-4th submetal layer 124. The 2-1st submetal layer 121, the 2-2nd submetal layer 122, the 2-3rd submetal layer 123, and the 2-4th submetal layer 124 may be arranged in the same layer (or formed as the same layer) and may be spaced apart in plan view.

The 2-1st submetal layer 121, the 2-2nd submetal layer 122, the 2-3rd submetal layer 123, and the 2-4th submetal layer 124 may block external light directed to the semiconductor layer 140, which includes an oxide semiconductor. External light may refer to light entering the rear portion of the display apparatus from the outside, or light that reaches the rear portion through the front portion and is reflected back from the rear portion of the display apparatus.

The 2-1st submetal layer 121 may have a shape corresponding to the first hold capacitor electrode CEh1. The 2-1st submetal layer 121 may be electrically connected to the second hold capacitor electrode CEh2 by an opening included in the first hold capacitor electrode CEh1.

The 2-3rd submetal layer 123 may be a second scan line GRL. The 2-3rd submetal layer 123 may extend in the x-axis direction. The 2-3rd submetal layer 123 may be connected to the gate layer 150. The 2-3rd submetal layer 123 may be connected to a gate area G3 of a third transistor T3.

The 2-4th submetal layer 124 may be a second light emission control line EMBL. The 2-4th submetal layer 124 may extend in the x-axis direction. The 2-4th submetal layer 124 may be connected to a gate area of the sixth transistor T6.

Figure 7:
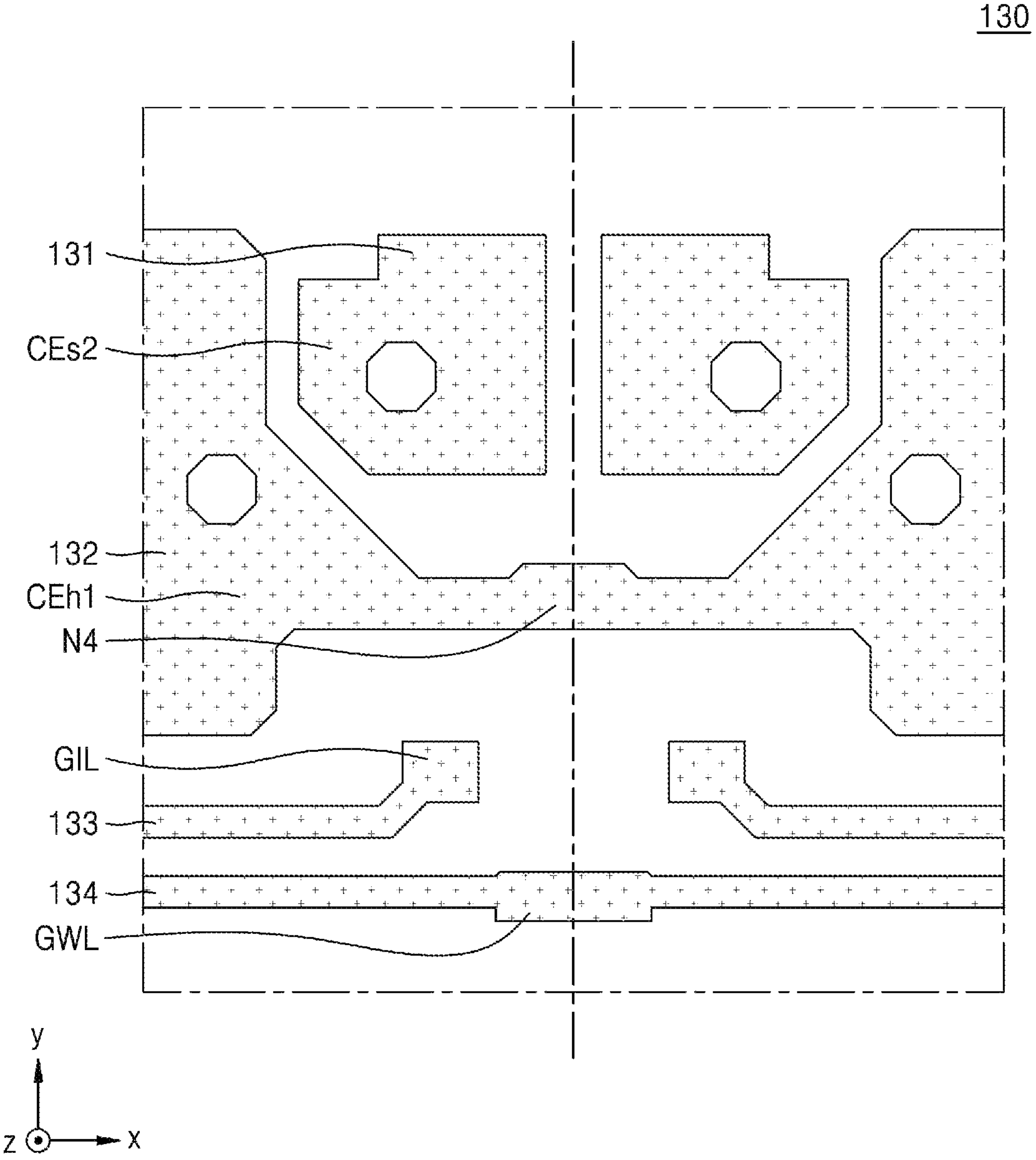

As shown in FIG. 4 and FIG. 7, the first submetal layer 130 may have a left-right symmetrical structure based on the dotted line of FIG. 7. Hereinafter, for convenience of description, only one side of the structure will be described based on the symmetrical structure.

The first submetal layer 130 may include a 1-1st submetal layer 131, a 1-2nd submetal layer 132, a 1-3rd submetal layer 133, and a 1-4th submetal layer 134. The 1-1st submetal layer 131 and the 1-4th submetal layer 134 may be arranged in the same layer (or formed as the same layer) and may be spaced apart from each other in plan view.

The 1-1st submetal layer 131 may be a second storage capacitor electrode CEs2. The 1-1st submetal layer 131 may have a relatively large area in plan view as a shield shape. The 1-1st submetal layer 131 may include a through hole, through which a configuration arranged below the 1-1st submetal layer 131 and a configuration arranged above the 1-1st submetal layer 131 may be electrically connected to each other.

The 1-2nd submetal layer 132 may be a first hold capacitor electrode CEh1. The 1-2nd submetal layer 132 may have a relatively large area in plan view as a shield shape. The 1-2nd submetal layer 132 may include a through hole, through which a configuration arranged below the 1-2nd submetal layer 132 and a configuration arranged above the 1-2nd submetal layer 132 may be electrically connected to each other. The 1-2nd submetal layer 132 may be connected to the fourth node N4 and may be electrically connected to other components connected by the fourth node N4.

The 1-3rd submetal layer 133 may extend in the x-axis direction. The 1-3rd submetal layer 133 may be a third scan line GIL. The 1-3rd submetal layer 133 may be connected to a gate area of the fourth transistor T4.

The 1-4th submetal layer 134 may extend in the x-axis direction. The 1-4th submetal layer 134 may be a first scan line GWL. The 1-4th submetal layer 134 may be connected to a gate area of the second transistor T2.

Figure 8:
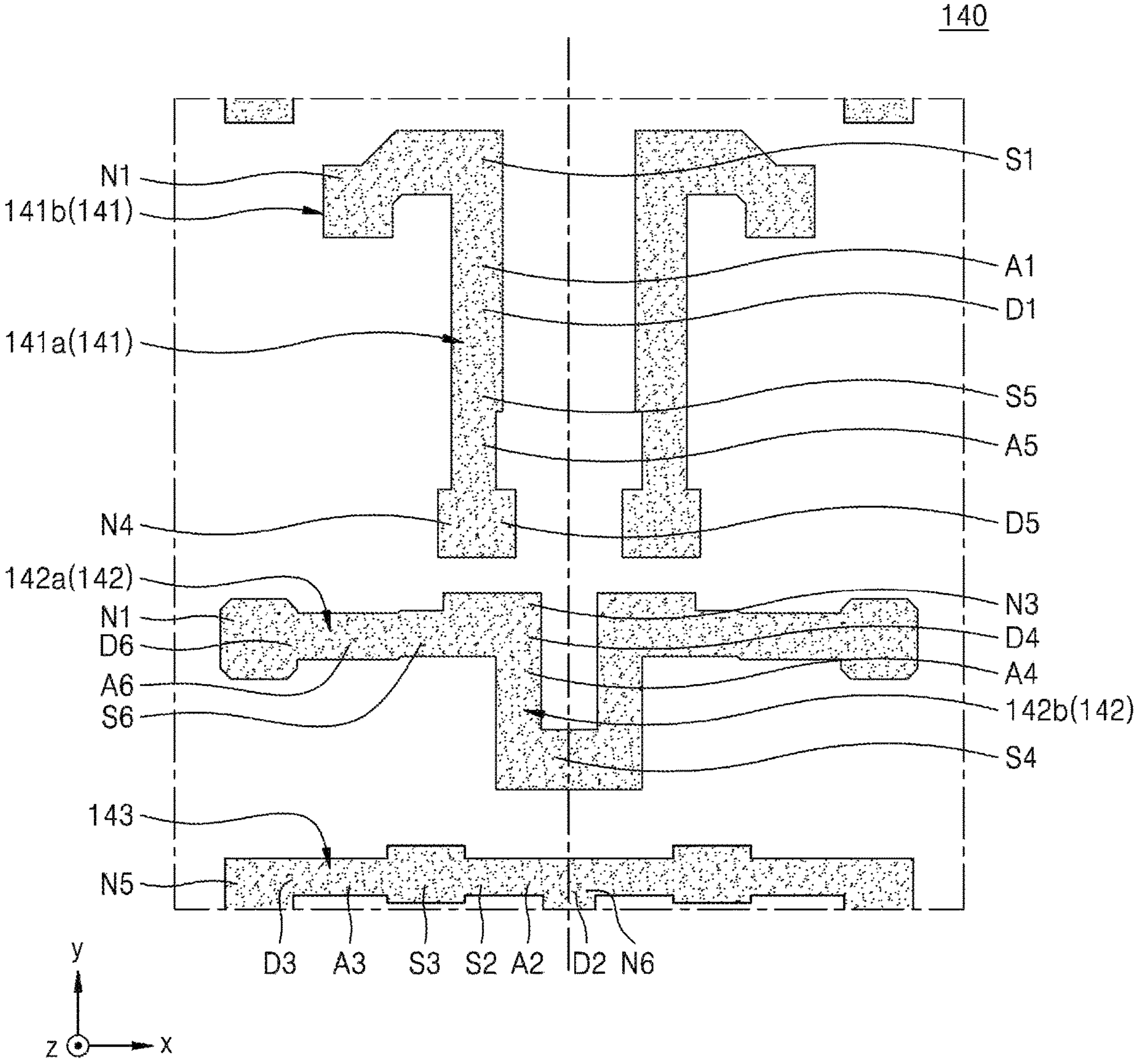

As shown in FIG. 4 and FIG. 8, the semiconductor layer 140 may have a left-right symmetrical structure based on the dotted line in FIG. 8. Hereinafter, for convenience of description, only one side of the structure will be described based on the symmetrical structure.

The semiconductor layer 140 may include a first sub-semiconductor layer 141, a second sub-semiconductor layer 142, and a third sub-semiconductor layer 143 in plan view. The first sub-semiconductor layer 141, the second sub-semiconductor layer 142, and the third sub-semiconductor layer 143 may be arranged in the same layer (or formed as the same layer) and together compose the semiconductor layer 140 in plan view, and may all be in a staggered configuration in plan view.

The first sub-semiconductor layer 141 may extend in the y-axis direction and may be divided into a first area 141*a* connected to the fourth node N4 and a second area 141*b* connected to the first node N1. The first area 141*a* of the first sub-semiconductor layer 141 may correspond to a semiconductor layer 140 of the first transistor T1 and a semiconductor layer 140 of the fifth transistor T5. The first area 141*a* of the first sub-semiconductor layer 141 may include a source area S1 of the first transistor T1, a channel area A1 of the first transistor T1, and a drain area D1 of the first transistor T1. In the second area 141*b* of the first sub-semiconductor layer 141, the source area S1 of the first transistor T1 may extend in the first direction (e.g., y-axis direction) and may be connected to the first node N1. For example, the source area S1 of the first transistor T1 may be connected to the first node N1.

The first area 141*a* of the first sub-semiconductor layer 141 may include a source area S5 of the fifth transistor T5, a channel area A5 of the fifth transistor T5, and a drain area D5 of the fifth transistor T5. The drain area D5 of the fifth transistor T5 may be connected to the fourth node N4. The drain area D1 of the first transistor T1 and the source area S5 of the fifth transistor T5 may be formed to be connected (e.g., directly connected), and may be integral with each other.

The second sub-semiconductor layer 142 may include a first area 142*a* extending in the x-axis direction and connected to the first node N1, and a second area 142*b* extending in the y-axis direction and connected to an initialization voltage Vint. The first area 142*a* of the second sub-semiconductor layer 142 may correspond to a semiconductor layer 140 of the sixth transistor T6. The first area 142*a* of the second sub-semiconductor layer 142 may include a source area S6 of the sixth transistor T6, a channel area A6 of the sixth transistor T6, and a drain area D6 of the sixth transistor T6. In the first area 142*a* of the second sub-semiconductor layer 142, the drain area D6 of the sixth transistor T6 may extend in the second direction (e.g., x-axis direction) and be connected to the first node N1. For example, the drain area D6 of the sixth transistor T6 may be connected to the first node N1.

The second area 142*b* of the second sub-semiconductor layer 142 may include a source area S4 of the fourth transistor T4, a channel area A4 of the fourth transistor T4, and a drain area D4 of the fourth transistor T4. The second area 142*b* of the second sub-semiconductor layer 142 may be connected to the initialization voltage Vint. The drain area D4 of the fourth transistor T4 and the source area S6 of the sixth transistor T6 may be formed to be directly connected, and may be integral with each other.

The third sub-semiconductor layer 143 may be connected to the fifth node N5 and the sixth node N6, may extend in the x-axis direction, corresponds to a semiconductor layer 140 of the third transistor T3, and may correspond to a semiconductor layer 140 of the second transistor T2.

The third sub-semiconductor layer 143 may include a source area S3 of the third transistor T3, a channel area A3 of the third transistor T3, and a drain area D3 of the third transistor T3. For example, the third sub-semiconductor layer 143 may include a source area S2 of the second transistor T2, a channel area A2 of the second transistor T2, and a drain area D2 of the second transistor T2. The source area S3 of the third transistor T3 and the source area S2 of the second transistor T2 may be formed to be directly connected, and may be integral with each other. The drain area D3 of the third transistor T3 may be connected to the fifth node N5, and the drain area D2 of the second transistor T2 may be connected to the sixth node N6.

Figure 9:
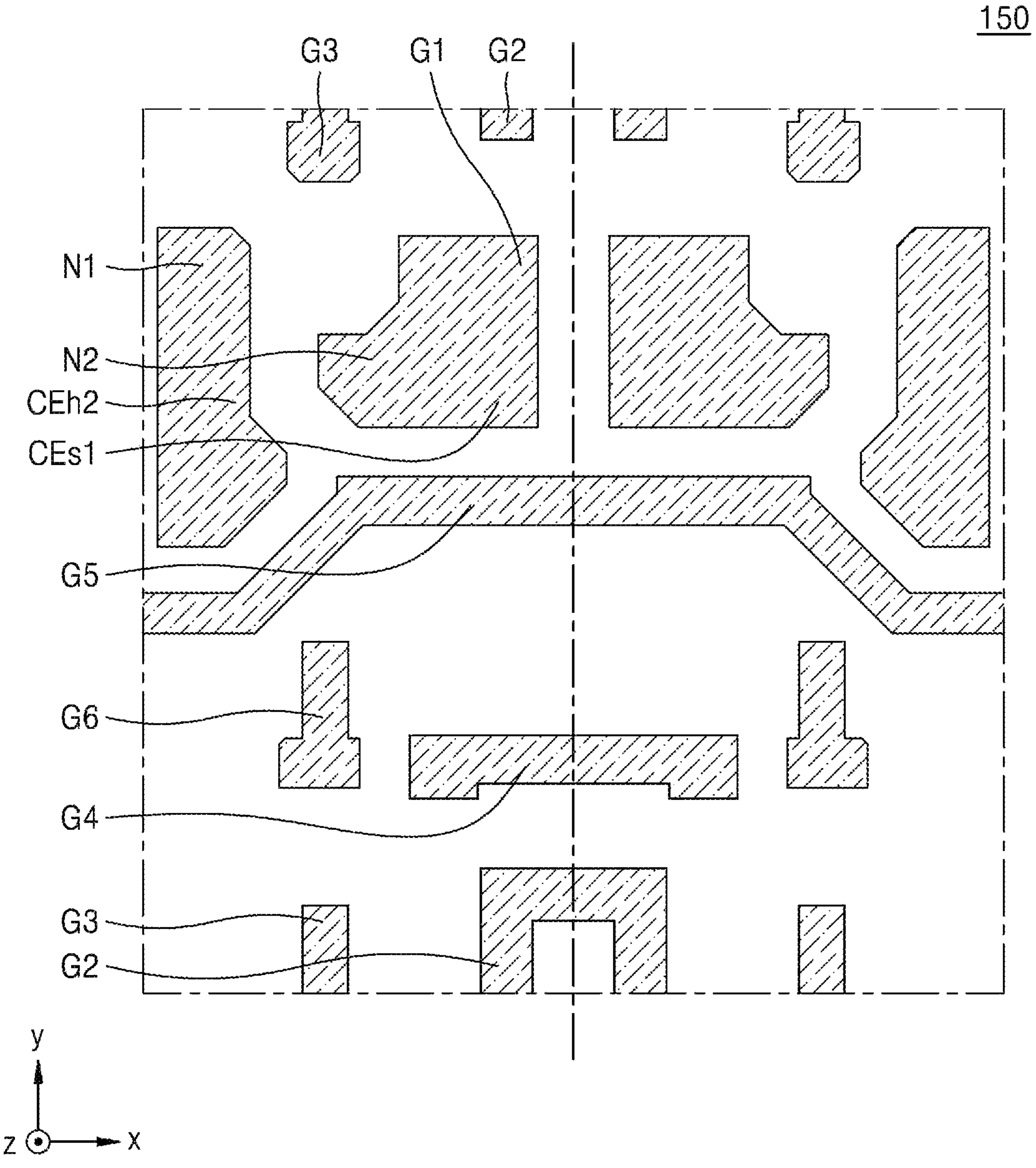

As shown in FIG. 4 and FIG. 9, the gate layer 150 may have a left-right symmetrical structure based on the dotted line in FIG. 9. Hereinafter, for convenience of description, only one side of the structure will be described based on the symmetrical structure.

The gate layer 150 may include a gate area G1 of the first transistor T1, a gate area G2 of the second transistor T2, a gate area G3 of the third transistor T3, a gate area G4 of the fourth transistor T4, a gate area G5 of the fifth transistor T5, and a gate area G6 of the sixth transistor T6.

The gate area G1 of the first transistor T1 may be a first storage capacitor electrode CEs1. The gate area G1 of the first transistor T1 may be connected to the second node N2. The gate area G1 of the first transistor T1 may be arranged over the first area 141*a* of the first sub-semiconductor layer 141. When viewed in a direction perpendicular to the substrate 100 (or in plan view), the gate area G1 of the first transistor T1 may overlap the channel area A1 of the first transistor T1 in the first area 141*a* of the first sub-semiconductor layer 141.

The second hold capacitor electrode CEh2 may be spaced apart from the gate area G1 of the first transistor T1 in the second direction (e.g., x-axis direction), and may be connected to the first node N1. The second hold capacitor electrode CEh2 may be arranged over the first hold capacitor electrode CEh1 of the first submetal layer 130. For example, the second hold capacitor electrode CEh2 may overlap the first hold capacitor electrode CEh1 when viewed in a direction perpendicular to the substrate 100 (or in plan view).

The gate area G2 of the second transistor T2 may receive the first scan signal GW. The gate area G2 of the second transistor T2 may be arranged to be spaced apart in the first direction (e.g., y-axis direction) from the gate area G4 of the fourth transistor T4 to be described below.

The gate area G3 of the third transistor T3 may receive the second scan signal GL. The gate area G3 of the third transistor T3 may be arranged to be spaced apart in the first direction (e.g., y-axis direction) from the gate area G6 of the sixth transistor T6 to be described below in the plan view, and may be arranged to be spaced apart in the second direction (e.g., x-axis direction) from the gate area G2 of the second transistor T2.

The gate area G4 of the fourth transistor T4 may extend in the second direction (e.g., x-axis direction) and may receive the third scan signal GI. The gate area G4 of the fourth transistor T4 may be arranged between the gate area G5 of the fifth transistor T5 and the gate area G2 of the second transistor T2 in a plan view. The gate area G4 of the fourth transistor T4 may be arranged to be spaced apart in the second direction (e.g., x-axis direction) from the gate area G6 of the sixth transistor T6.

The gate area G5 of the fifth transistor T5 may extend in the second direction (e.g., x-axis direction) and may receive the first light emission control signal EM. The gate area G5 of the fifth transistor T5 may be arranged to be spaced apart in the first direction (e.g., y-axis direction) from the gate area of the first transistor T1 and the second hold capacitor electrode CEh2 in a plan view. The gate area G5 of the fifth transistor T5 may be arranged between the gate area G1 of the first transistor T1 and the gate area G4 of the fourth transistor T4.

The gate area G6 of the sixth transistor T6 may extend in the first direction (e.g., y-axis direction) and may receive the second light emission control signal EMB. The gate area G6 of the sixth transistor T6 may be arranged to be spaced apart in a second direction (e.g., x-axis direction) from the gate area G4 of the fourth transistor T4 and in the first direction (e.g., y-axis direction) from the gate area G3 of the third transistor T3, in a plan view.

Figure 10:
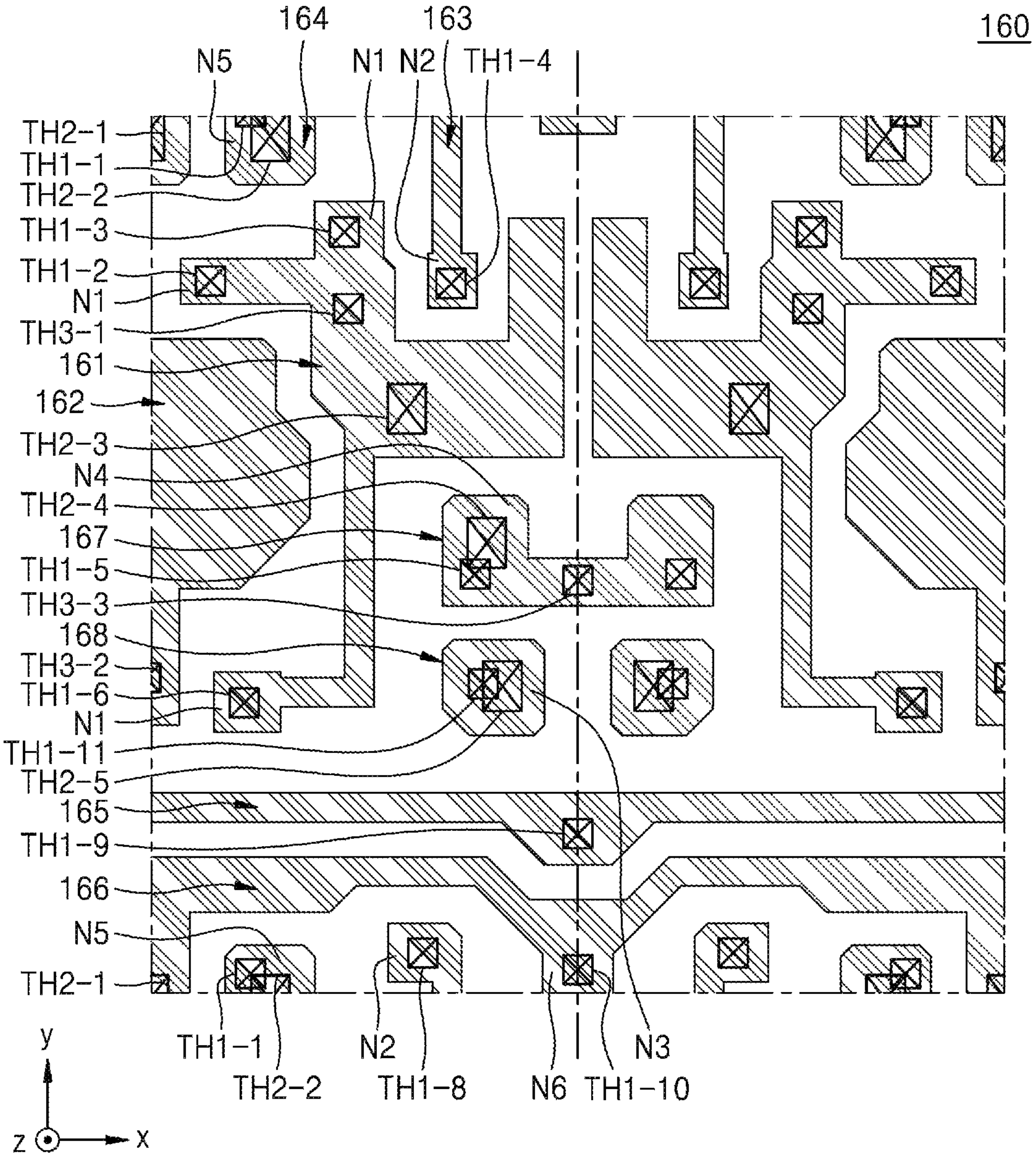

As shown in FIG. 4 and FIG. 10, the first conductive layer 160 may have a left-right symmetrical structure based on the dotted line in FIG. 10. Hereinafter, for convenience of description, only one side of the structure will be described based on the symmetrical structure.

The first conductive layer 160 may include a 1-1st sub-conductive layer (or first-first conductive layer) 161, a 1-2nd subconductive layer 162, a 1-3rd subconductive layer 163, a 1-4th subconductive layer 164, a 1-5th subconductive layer 165, a 1-6th subconductive layer 166, a 1-7th subconductive layer 167, and a 1-8th subconductive layer 168. The 1-1st subconductive layer 161, the 1-2nd subconductive layer 162, the 1-3rd subconductive layer 163, the 1-4th subconductive layer 164, the 1-5th subconductive layer 165, the 1-6th subconductive layer 166, the 1-7th subconductive layer 167, and the 1-8th subconductive layer 168 may be arranged in the same layer (or formed as the same layer) and together compose the first conductive layer 160 in plan view, and may all be in a staggered configuration in plan view.

The 1-1st subconductive layer 161 of the first conductive layer 160 may be connected to other layers by through holes. The 1-1st subconductive layer 161 may be connected to the first node N1. For example, the 1-1st subconductive layer 161 may be electrically connected to other components that are connected to the first node N1.

The 1-1st subconductive layer 161 may be connected to the second hold capacitor electrode CEh2 by a 1-2nd through hole TH1-2. The 1-1st subconductive layer 161 may be connected to the source area S1 of the first transistor T1 by a 1-3rd through hole TH1-3. For example, the 1-1st subconductive layer 161 may be connected to the second area 141*b* of the first sub-semiconductor layer 141 by the 1-3rd through hole TH1-3. The 1-1st subconductive layer 161 may be connected to the first area 142*a* of the second sub-semiconductor layer 142 by a 1-6th through hole TH1-6. For example, the 1-1st subconductive layer 161 may be connected to the drain area D6 of the sixth transistor T6 by the 1-6th through hole TH1-6.

The 1-1st subconductive layer 161 may be connected to the second conductive layer 170 by a 2-3rd through hole TH2-3. For example, the 1-1st subconductive layer 161 may be connected to a 2-1st subconductive layer 171 by the 2-3rd through hole TH2-3. As will be described below, the 2-1st subconductive layer 171 may be connected to the source area S1 of the first transistor T1.

The 1-1st subconductive layer 161 may be connected to the first submetal layer 130 by the 3-1st through hole TH3-1. For example, the 1-1st subconductive layer 161 may be connected to a second storage capacitor electrode CEs2 of the gate layer 150 by the 3-1st through hole TH3-1. For convenience of description, the 1-1st subconductive layer 161 may be referred to as the first-first subconductive layer.

The 1-2nd subconductive layer 162 of the first conductive layer 160 may be spaced apart from the 1-1st subconductive layer 161 in plan view. The 1-2nd subconductive layer 162 may be connected to the first submetal layer 130 by a 3-2nd through hole TH3-2. For example, the 1-2nd subconductive layer 162 may be connected to a first hold capacitor electrode CEh1 of the first submetal layer 130 by the 3-2nd through hole TH3-2.

The 1-3rd subconductive layer 163 of the first conductive layer 160 may be spaced apart from the 1-1st subconductive layer 161 and the 1-2nd subconductive layer 162 in plan view. The 1-3rd subconductive layer 163 may be connected to the second node N2. The 1-3rd subconductive layer 163 may be connected to the first storage capacitor electrode CEs1 by the 1-4th through hole TH1-4. The 1-3rd subconductive layer 163 may extend in the y-axis direction. For example, the 1-3rd subconductive layer 163 may extend in parallel with the direction in which the drive voltage line PL of the second conductive layer 170 extends.

Since the pixels are formed in a repeating pattern, the 1-3rd subconductive layer 163 may be connected to the semiconductor layer 140 by a 1-8th through hole TH1-8 of a corresponding pixel. For example, the 1-3rd subconductive layer 163 may be connected to the third sub-semiconductor layer 143 by the 1-8th through hole TH1-8 of the corresponding pixel. For example, the 1-3rd subconductive layer 163 may be connected to the source area S3 of the third transistor T3 and the source area S2 of the second transistor T2 of the third sub-semiconductor layer 143 by the 1-8th through hole TH1-8 of the corresponding pixel.

The 1-4th subconductive layer 164 of the first conductive layer 160 may be spaced apart from the 1-1st subconductive layer 161, the 1-2nd subconductive layer 162, and the 1-3rd subconductive layer 163 in a plan view. The 1-4th subconductive layer 164 may be connected to the fifth node N5. The 1-4th subconductive layer 164 may be connected to the semiconductor layer 140 by a 1-1st through hole TH1-1. The 1-4th subconductive layer 164 may be connected to the third sub-semiconductor layer 143 by the 1-1st through hole TH1-1. The 1-4th subconductive layer 164 may be connected to the drain area D3 of the third transistor T3 by the 1-1st through hole TH1-1.

The 1-4th subconductive layer 164 may be connected to the second conductive layer 170 by the 2-2nd through hole TH2-2. The 1-4th subconductive layer 164 may be connected to the 2-3rd subconductive layer 173 by the 2-2nd through hole TH2-2. The 1-4th subconductive layer 164, in connection with the 2-3rd subconductive layer 173, may transfer a reference voltage VREF to the drain area D3 of the third transistor T3.

The 1-5th subconductive layer 165 of the first conductive layer 160 may extend in the x-axis direction. The 1-5th subconductive layer 165 may be spaced apart in plan view from the 1-1st subconductive layer 161 to the 1-4th subconductive layer 164.

The 1-5th subconductive layer 165 may include a 1-9th through hole TH1-9. The 1-5th subconductive layer 165 may be connected to the semiconductor layer 140 by the 1-9th through hole TH1-9. The 1-5th subconductive layer 165 may be connected to the second sub-semiconductor layer 142 by the 1-9th through hole TH1-9. The 1-5th subconductive layer 165 may be connected to the source area S4 of the fourth transistor T4 by the 1-9th through hole TH1-9.

The 1-6th subconductive layer 166 of the first conductive layer 160 may extend in the x-axis direction. The 1-6th subconductive layer 166 may be spaced apart in plan view from the 1-1st subconductive layer 161 to the 1-5th subconductive layer 165.

The 1-6th subconductive layer 166 may be connected to the sixth node N6. The 1-6th subconductive layer 166 may include a 1-10th through hole TH1-10. The 1-6th subconductive layer 166 may be connected to the semiconductor layer 140 by the 1-10th through hole TH1-10. The 1-6th subconductive layer 166 may be connected to the third sub-semiconductor layer 143 by the 1-10th through hole TH1-10. The 1-6th subconductive layer 166 may be connected to the drain area D2 of the second transistor T2 by the 1-10th through hole TH1-10.

Since the pixels are formed in a repeating pattern, the 1-6th subconductive layer 166 may be connected to the second conductive layer 170 by a 2-1st through hole TH2-1 of a corresponding pixel. The 1-6th subconductive layer 166 may be connected to a 2-4th subconductive layer 174 by the 2-1st through hole TH2-1 of the corresponding pixel.

The 1-7th subconductive layer 167 of the first conductive layer 160 may extend in the x-axis direction. The 1-7th subconductive layer 167 may be spaced apart in plan view from the 1-1st subconductive layer 161 to the 1-6th subconductive layer 166.

The 1-7th subconductive layer 167 may include a 1-5th through hole TH1-5. The 1-7th subconductive layer 167 may be connected to the fourth node N4. The 1-7th subconductive layer 167 may be connected to the semiconductor layer 140 by the 1-5th through hole TH1-5. The 1-7th subconductive layer 167 may be connected to the first sub-semiconductor layer 141 by the 1-5th through hole TH1-5. The 1-7th subconductive layer 167 may be connected to the drain area D5 of the fifth transistor T5 by the 1-5th through hole TH1-5.

The 1-7th subconductive layer 167 may include a 2-4th through hole TH2-4. The 1-7th subconductive layer 167 may be connected to the second conductive layer 170 by the 2-4th through hole TH2-4. The 1-7th subconductive layer 167 may be connected to a 2-2nd subconductive layer 172 (e.g., a drive power wiring) by the 2-4th through hole TH2-4. The 1-7th subconductive layer 167 may be connected to the 2-2nd subconductive layer 172 to transfer the drive voltage ELVDD to the fifth transistor T5.

The 1-7th subconductive layer 167 may include a 3-3rd through hole TH3-3. The 1-7th subconductive layer 167 may be connected to the first submetal layer 130 by the 3-3rd through hole TH3-3. The 1-7th subconductive layer 167 may be connected to the first hold capacitor electrode CEh1 of the first submetal layer 130 by the 3-3rd through hole TH3-3.

The 1-8th subconductive layer 168 of the first conductive layer 160 may be spaced apart in plan view from the 1-1st subconductive layer 161 to the 1-7th subconductive layer 167.

The 1-8th subconductive layer 168 may be connected to the third node N3. The 1-8th subconductive layer 168 may include a 1-11th through hole TH1-11. The 1-8th subconductive layer 168 may be connected to the semiconductor layer 140 by the 1-11th through hole TH1-11. The 1-8th subconductive layer 168 may be connected to the second sub-semiconductor layer 142 by the 1-11th through hole TH1-11. The 1-8th subconductive layer 168 may be connected to the drain area D4 of the fourth transistor T4 and the source area S6 of the sixth transistor T6 by the 1-11th through hole TH1-11.

Figure 11:
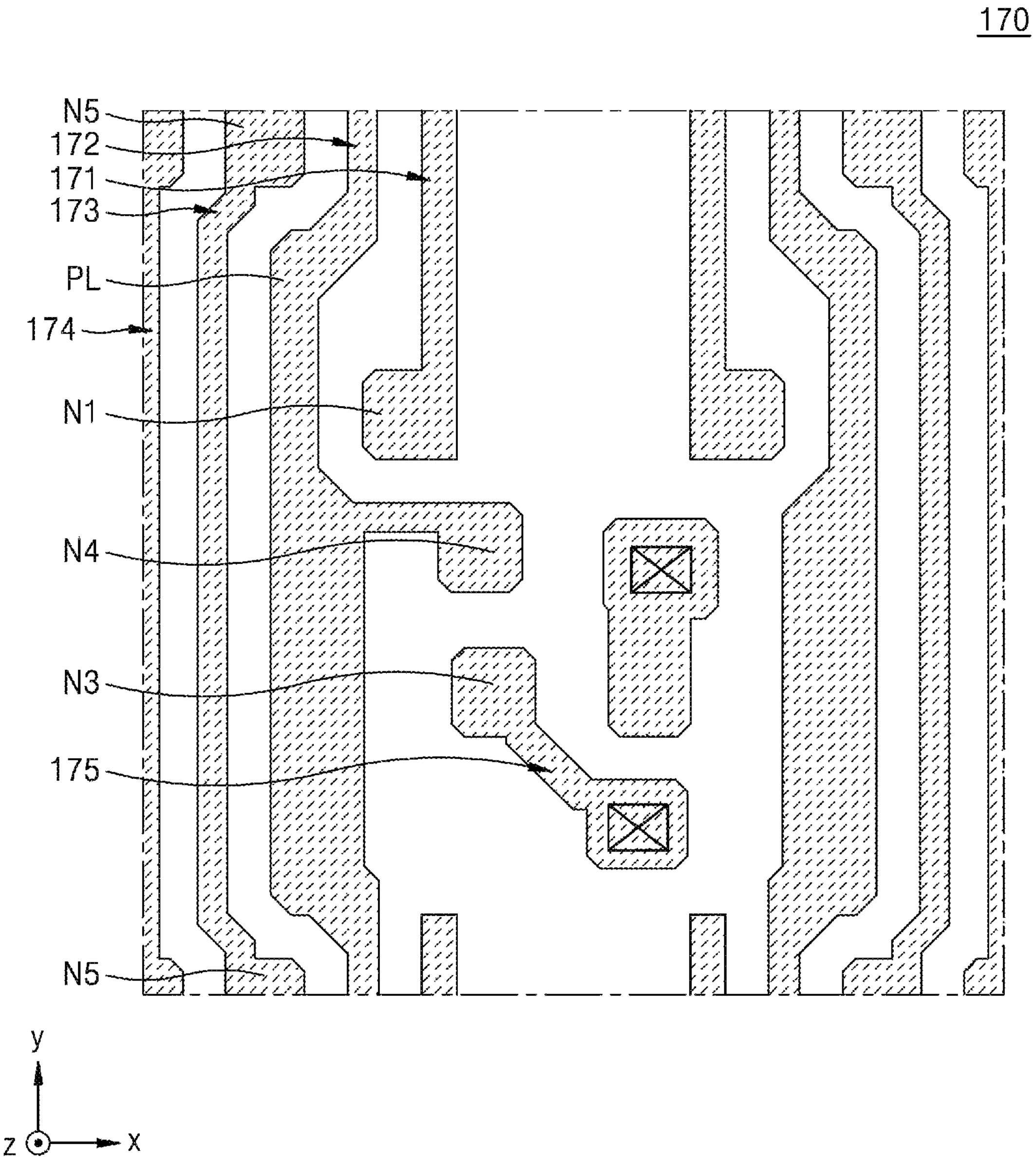

As shown in FIG. 4 and FIG. 11, the second conductive layer 170 may have a roughly left-right symmetrical structure based on the dotted line of FIG. 10. Hereinafter, for convenience of description, only one side of the structure will be described based on the symmetrical structure.

The second conductive layer 170 may include a 2-1st subconductive layer 171, a 2-2nd subconductive layer 172, a 2-3rd subconductive layer 173, a 2-4th subconductive layer 174, and a 2-5th subconductive layer 175. The 2-1st subconductive layer 171 to the 2-4th subconductive layer 174 may be arranged in the same layer (or formed as the same layer) and together compose the second conductive layer 170 in plan view, and may all be in a staggered configuration in plan view. The 2-1st subconductive layer 171 to the 2-4th subconductive layer 174 may extend in the y-axis direction (or first direction).

The 2-1st subconductive layer 171 may be connected to the first node N1. The 2-1st subconductive layer 171 may be electrically connected to other components by the 2-3rd through hole TH2-3 of the 1-1st subconductive layer 161.

The 2-1st subconductive layer 171 may form a capacitor with the 1-3rd subconductive layer 163. The capacitor formed by the 2-1st subconductive layer 171 and the 1-3rd subconductive layer 163 may be a storage capacitor Cst. The 2-1st subconductive layer 171 may be electrically connected to the second storage capacitor electrode CEs2, and the 1-3rd subconductive layer 163 may be electrically connected to the first storage capacitor electrode CEs1. For example, the 2-1st subconductive layer 171 may function as the second storage capacitor electrode CEs2, and the 1-3rd subconductive layer 163 may function as the first storage capacitor electrode CEs1.

For example, the 1-3rd subconductive layer 163 and the 2-1st subconductive layer 171 each function as a storage capacitor electrode, and a parasitic capacitor Cpara generated by the 1-3rd subconductive layer 163 and the 2-1st subconductive layer 171 may be converted into a storage capacitor Cst. Thus, the parasitic capacitor Cpara may be minimized or prevented, and the storage capacitor Cst connected to the first transistor T1 may be increased or controlled with a pre-stored capacity.

Furthermore, as the 2-1st subconductive layer 171 is arranged between the 1-3rd subconductive layer 163 and the pixel electrode 210, the parasitic capacitor Cpara, which is formed between the 1-3rd subconductive layer 163 and the pixel electrode 210, may be converted into the storage capacitor Cst or shielded by the 2-1st subconductive layer 171. For example, the parasitic capacitor Cpara may be minimized or prevented, and the storage capacitor Cst connected to the first transistor T1 may be increased or controlled with a pre-stored capacity.

In case that the drive voltage ELVDD is applied to the 2-1st subconductive layer 171 overlapping the 1-3rd subconductive layer 163, the capacitor formed between the 1-3rd subconductive layer 163 and the 2-1st subconductive layer 171 may become a parasitic capacitor Cpara. Therefore, the embodiments may eliminate (or minimize) such a parasitic capacitor Cpara by connecting the 2-1st subconductive layer 171 and the source area S1 of the first transistor T1 and by connecting the 1-3rd subconductive layer 163 and the gate area G1 of the first transistor T1.

When viewed in a direction perpendicular to the substrate 100 (or in plan view), the 2-1st subconductive layer 171 may cover the 1-3rd subconductive layer 163. For example, when viewed in a direction perpendicular to the substrate 100 (or in plan view), the 2-1st subconductive layer 171 may overlap the 1-3rd subconductive layer 163. The 2-1st subconductive layer 171 may not perfectly overlap the 1-3rd subconductive layer 163. In some cases, the 2-1st subconductive layer 171 may not overlap a protruding portion of the 1-3rd subconductive layer 163, but the 2-1st subconductive layer 171 may overlap a majority of the area of the 1-3rd subconductive layer 163. For example, at least a portion of the 2-1st subconductive layer 171 may overlap the 1-3rd subconductive layer 163.

For convenience of description, the 1-3rd subconductive layer 163 may be referred to as the first subconductive layer or a first wiring, and the 2-1st subconductive layer 171 may be referred to as the second subconductive layer or a second wiring.

The 2-1st subconductive layer 171 may have a rod shape extending in the x-axis direction (or second direction). The x-axis direction (or second direction) may refer to a direction that is intersecting or orthogonal to the y-axis direction.

The 2-2nd subconductive layer 172 may be connected to the fourth node N4. The 2-2nd subconductive layer 172 may be electrically connected to other components by the 2-4th through hole TH2-4 of the 1-7th subconductive layer 167. The 2-2nd subconductive layer 172 may be spaced apart in plan view from the 2-1st subconductive layer 171.

For example, the 2-2nd subconductive layer 172 may be connected to the drive voltage line PL. The 2-2nd subconductive layer 172 may receive the drive voltage ELVDD. An average width in the x-axis direction of the 2-2nd subconductive layer 172 may be larger than an average width in the x-axis direction of the 2-1st subconductive layer 171, the 2-3rd subconductive layer 173, and the 2-4th subconductive layer 174. This is to effectively transfer the high voltage drive voltage to the other components.

The 2-3rd subconductive layer 173 may be connected to the fifth node N5. The 2-3rd subconductive layer 173 may be electrically connected to the other components by the 2-2nd through hole TH2-2 of the 1-4th subconductive layer 164. The 2-3rd subconductive layer 173 may be spaced apart in plan view from the 2-1st subconductive layer 171 and the 2-2nd subconductive layer 172.

The 2-4th subconductive layer 174 may be electrically connected to the other components by the 2-1st through hole TH2-1 of the 1-6th subconductive layer 166. The 2-4th subconductive layer 174 may be spaced apart in plan view from the 2-1st subconductive layer 171 to the 2-3rd subconductive layer 173.

The 2-5th subconductive layer 175 may be connected to the third node N3. The 2-5th subconductive layer 175 may be electrically connected to other components by a 2-5th through hole TH2-5 of the 1-8th subconductive layer 168. The 2-5th subconductive layer 175 may be spaced apart in plan view from the 2-1st subconductive layer 171 to the 2-4th subconductive layer 174. The 2-5th subconductive layer 175 may be connected to an organic light-emitting diode OLED.

Figure 12:
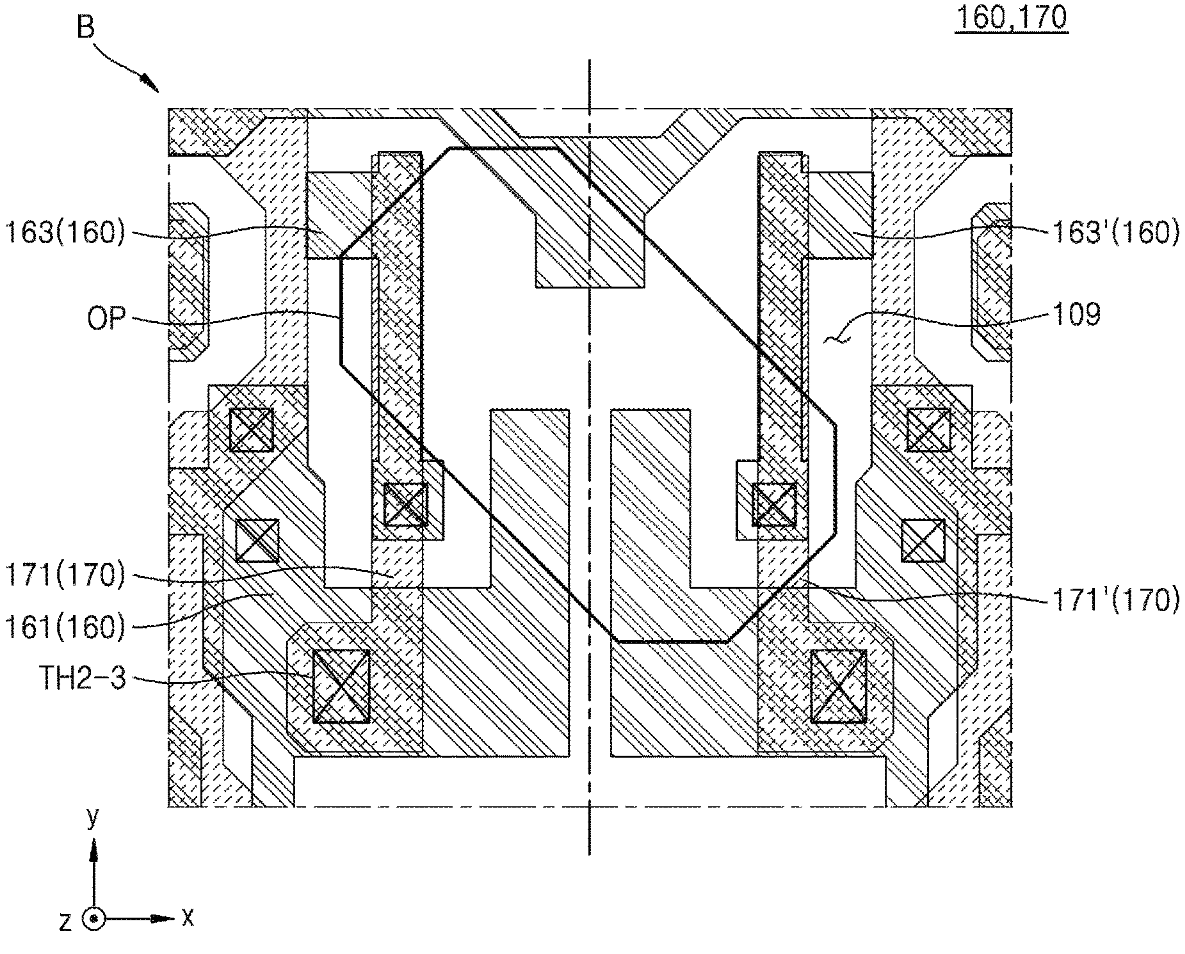
FIG. 12 is a schematic plan view illustrating only the first conductive layer and second conductive layer overlapping in an area B of FIG. 4.

FIG. 12 is a schematic plan view illustrating only the first conductive layer and second conductive layer overlapping with each other in an area B of FIG. 4. Any descriptions of FIG. 12 that are identical to or redundant of those described above may be omitted for descriptive convenience.

As shown in FIG. 12, the first conductive layer 160 and the second conductive layer 170 may have a roughly left-right symmetrical structure based on the dotted lines of FIG. 12. Hereinafter, for convenience of description, only one side of the structure will be described based on the symmetrical structure.

In area B, the first conductive layer 160 and the second conductive layer 170 may overlap at least partially when viewed in a direction perpendicular to the substrate 100 (or in plan view). For convenience of description, a pixel opening OP of the pixel defining film 109 is shown arranged on the first conductive layer 160 and the second conductive layer 170.

The pixel opening OP of the pixel defining film 109 may be a single pixel area. The 1-3rd subconductive layer 163 extend in the y-axis direction (or first direction) and may partially overlap the pixel opening of the pixel defining film 109 when viewed in a direction perpendicular to the substrate 100 (or in plan view). The 2-1st subconductive layer 171 extend in the y-axis direction (or first direction) and may partially overlap the opening of the pixel defining film 109 when viewed in a direction perpendicular to the substrate 100 (or in plan view).

The 1-3rd subconductive layer 163 and the 2-1st subconductive layer 171 may have a rod shape extending in the y-axis direction. A rod shape may refer to a shape in which the width in the y-axis direction is greater than the width in the x-axis direction.

The first conductive layer 160 may further include a first additional subconductive layer 163' arranged at a position symmetrical to the 1-3rd subconductive layer 163, centered on the pixel opening OP when viewed in a direction perpendicular to the substrate 100 (or in plan view), and that has a shape corresponding to the shape of the 1-3rd subconductive layer 163, and arranged in the same layer (or formed as the same layer) as the 1-3rd subconductive layer 163.

The second conductive layer 170 may further include a second additional subconductive layer 171', which is arranged in a position symmetrical to the 2-1st subconductive layer 171 centered on the pixel opening OP when viewed in a direction perpendicular to the substrate 100 (or in plan view) and has a shape corresponding to the shape of the 2-1st subconductive layer 171 and is arranged in the same layer (or formed as the same layer) as the 2-1st subconductive layer 171.

However, in the specification, referring to the shapes of A and B as corresponding may mean that A and B have shapes that are symmetrical to each other with respect to the dotted line of FIG. 12.

The 2-3rd through hole TH2-3 connecting the 1-1st subconductive layer 161 and the 2-1st subconductive layer 171 may be arranged so that the 2-3rd through hole TH2-3 may not overlap the opening of the pixel defining film 109 when viewed in a direction perpendicular to the substrate 100 (or in plan view). For example, the 2-3rd through hole TH2-3 may be arranged outside the opening of the pixel defining film 109 when viewed in a direction perpendicular to the substrate 100 (or in plan view).

In the display apparatus, the second conductive layer 170 may cause a change in wavelength, resulting in a color shift. However, the color shift phenomenon may be improved, as the 2-1st subconductive layer 171 has a rod shape and is symmetrically arranged with respect to the dotted line (or the opening of the pixel defining film 109), and as the 2-3rd through hole TH2-3 are arranged outside the opening of the pixel defining film 109.

The disclosure has thus been described with reference to the embodiments shown in the drawings, which are only examples, and one of ordinary skill in the art will understand that various modifications and equally other embodiments are possible. Therefore, the true scope of technical protection of the disclosure will be determined by the technical idea of the appended claims.

According to an embodiment, it is possible to implement a display apparatus, in which the parasitic capacitor is minimized or prevented. The scope of the disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
a substrate;
a semiconductor layer disposed on the substrate and comprising a source area, a drain area, and a channel area disposed between the source area and the drain area;
a gate layer disposed on the semiconductor layer, and comprising a gate area disposed on the channel area;
a first conductive layer disposed on the gate layer and comprising a first subconductive layer electrically connected to the gate area;
a second conductive layer disposed on the first conductive layer, electrically connected to the source area, and comprising a second subconductive layer covering the first subconductive layer.

2. The display apparatus of claim 1, wherein at least a portion of the second subconductive layer overlaps the first subconductive layer in plan view.

3. The display apparatus of claim 1, further comprising:
a storage capacitor including:
a first storage capacitor electrode electrically connected to the first subconductive layer, and
a second storage capacitor electrode electrically connected to the second subconductive layer.

4. The display apparatus of claim 1, wherein the semiconductor layer comprises an oxide semiconductor.

5. The display apparatus of claim 1, further comprising:
a pixel electrode disposed on the second conductive layer; and
a pixel defining film adjacent to an edge portion of the pixel electrode, and comprising a pixel opening exposing at least a central area of the pixel electrode.

6. The display apparatus of claim 5, wherein the second subconductive layer is disposed between the first subconductive layer and the pixel electrode.

7. The display apparatus of claim 5, wherein
the first conductive layer further comprises a first-first subconductive layer connected to the source area, the first-first subconductive layer and the first subconductive layer formed as a same layer, and
the display apparatus further comprises a first organic insulation layer disposed between the first conductive layer and the second conductive layer, the first organic insulation layer comprising a through hole connecting the first-first subconductive layer and the second subconductive layer.

8. The display apparatus of claim 7, wherein the through hole of the first organic insulation layer is disposed outside the pixel opening in plan view.

9. The display apparatus of claim 8, wherein the first subconductive layer partially overlaps the pixel opening in plan view.

10. The display apparatus of claim 9, wherein the second subconductive layer partially overlaps the pixel opening in plan view.

11. The display apparatus of claim 7, wherein the first conductive layer further comprises a first additional subconductive layer disposed at a position symmetrical to the first subconductive layer around the pixel opening in plan view, the first additional subconductive layer having a shape corresponding to a shape of the first subconductive layer.

12. The display apparatus of claim 11, wherein the second conductive layer further comprises a second additional subconductive layer disposed at a position symmetrical to the second subconductive layer around the pixel opening in plan view, the second additional subconductive layer having a shape corresponding to a shape of the second subconductive layer.

13. The display apparatus of claim 12, wherein the second additional subconductive layer overlaps the first additional subconductive layer in plan view.

14. The display apparatus of claim 1, wherein, in plan view, the first subconductive layer extends in a first direction being parallel to a direction in which a drive power wiring of the second subconductive layer extends.

15. The display apparatus of claim 1, further comprising:

a first submetal layer disposed between the substrate and the semiconductor layer and including a second storage capacitor electrode, wherein the gate layer includes a first storage capacitor electrode, and the first storage capacitor electrode and the second storage capacitor electrode are included in a single storage capacitor.

16. The display apparatus of claim 15, wherein the semiconductor layer and the gate layer are included in a first transistor, and the first transistor is a source-follower type.

17. A display apparatus, comprising:

a substrate;

a first transistor disposed on the substrate, the first transistor comprising:

an oxide semiconductor layer comprising a source area, a channel area, and a drain area, and a gate area disposed on the channel area;

a first wiring connected to the gate area, disposed on the first transistor, and extending in a first direction;

a pixel electrode disposed on the first wiring; and a second wiring disposed between the first wiring and the pixel electrode, connected to the source area, and overlapping at least partially with the first wiring in plan view.

18. The display apparatus of claim 17, wherein the first wiring and the second wiring are included in a storage capacitor.

19. The display apparatus of claim 17, further comprising:

a first organic insulation layer disposed between the first wiring and the second wiring, the first organic insulation layer comprising a through hole connecting the first wiring and the second wiring; and a pixel defining film adjacent to an edge portion of the pixel electrode and comprising a pixel opening exposing at least a central portion of the pixel electrode, wherein the pixel electrode is disposed on the second wiring, and the through hole is disposed outside the pixel opening in plan view.

20. The display apparatus of claim 17, wherein the first transistor is a source-follower type.

21. The display apparatus of claim 17, further comprising:

a drive power wiring extending in the first direction, wherein the drive power wiring and the second wiring are formed as a same layer.

* * * * *